(12) United States Patent
Itonaga

(10) Patent No.: US 11,621,405 B2
(45) Date of Patent: Apr. 4, 2023

(54) DISPLAY DEVICE AND ELECTRONIC APPARATUS

(71) Applicant: SONY CORPORATION, Tokyo (JP)

(72) Inventor: Kazuichiro Itonaga, Tokyo (JP)

(73) Assignee: SONY CORPORATION, Tokyo (JP)

( * ) Notice: Subject to any disclaimer, the term of this patent is extended or adjusted under 35 U.S.C. 154(b) by 132 days.

(21) Appl. No.: 17/085,821

(22) Filed: Oct. 30, 2020

(65) Prior Publication Data
US 2021/0050554 A1 Feb. 18, 2021

Related U.S. Application Data

(63) Continuation of application No. 16/481,615, filed as application No. PCT/JP2018/001650 on Jan. 19, 2018, now Pat. No. 10,862,070.

(30) Foreign Application Priority Data

Feb. 13, 2017 (JP) .................. 2017-024413

(51) Int. Cl.
  *H01L 51/56* (2006.01)
  *H01L 27/32* (2006.01)
  *H01L 51/52* (2006.01)

(52) U.S. Cl.
  CPC ........ *H01L 51/5253* (2013.01); *H01L 27/322* (2013.01); *H01L 51/5206* (2013.01); *H01L 51/56* (2013.01); *H01L 51/5221* (2013.01)

(58) Field of Classification Search
  CPC . H01L 51/56; H01L 51/5221; H01L 27/3258; H01L 51/5206
  See application file for complete search history.

(56) References Cited

U.S. PATENT DOCUMENTS

| | | | |
|---|---|---|---|
| 10,256,165 B2* | 4/2019 | Chung | G09G 3/3685 |
| 2005/0077816 A1 | 4/2005 | Yamada et al. | |
| 2010/0230667 A1 | 9/2010 | Nakamura et al. | |

(Continued)

FOREIGN PATENT DOCUMENTS

| | | |
|---|---|---|
| CN | 101855939 A | 10/2010 |
| EP | 2219416 A1 | 8/2010 |

(Continued)

OTHER PUBLICATIONS

International Search Report and Written Opinion of PCT Application No. PCT/JP2018/001650, dated Apr. 17, 2018, 09 pages of English Translation and 08 pages of ISRWO.

(Continued)

*Primary Examiner* — Dale E Page
*Assistant Examiner* — Wilner Jean Baptiste
(74) *Attorney, Agent, or Firm* — Chip Law Group

(57) ABSTRACT

To provide a display device and an electronic apparatus that suppress leakage of a drive current between adjacent light emitting elements. A display device includes: a plurality of light emitting elements having an organic light emitting layer sandwiched between a first electrode disposed for each of the light emitting elements and a second electrode in a lamination direction and arrayed on a plane; and an insulating layer disposed between the first electrodes. At least a part of a film thickness region in the insulating layer contains a positively charged inorganic nitride.

13 Claims, 18 Drawing Sheets

(56) References Cited

U.S. PATENT DOCUMENTS

| | | |
|---|---|---|
| 2015/0084026 A1 | 3/2015 | Miyamoto et al. |
| 2015/0115259 A1 | 4/2015 | Yamazaki et al. |
| 2016/0268358 A1 | 9/2016 | Ito et al. |
| 2017/0141165 A1 | 5/2017 | Lv et al. |
| 2017/0309852 A1 | 10/2017 | Seo et al. |

FOREIGN PATENT DOCUMENTS

| | | |
|---|---|---|
| JP | 2012-022785 A | 2/2012 |
| JP | 2012-216338 A | 11/2012 |
| JP | 2014-225328 A | 12/2014 |
| JP | 2015-069700 A | 4/2015 |
| JP | 2015-092505 A | 5/2015 |
| JP | 2015-149194 A | 8/2015 |
| JP | 2016-167400 A | 9/2016 |
| KR | 10-2010-0101076 A | 9/2010 |
| TW | 200930677 A | 7/2009 |
| TW | 201318240 A | 5/2013 |
| WO | 2013/038971 A1 | 3/2013 |

OTHER PUBLICATIONS

International Preliminary Report on Patentability of PCT Application No. PCT/JP2018/001650, dated Aug. 22, 2019, 10 pages of English Translation and 05 pages of IPRP.

Non-Final Office Action for U.S. Appl. No. 16/481,615, dated Apr. 3, 2020, 09 pages.

Notice of Allowance for U.S. Appl. No. 16/481,615, dated Aug. 5, 2020, 08 pages.

\* cited by examiner

DISPLAY DEVICE AND ELECTRONIC APPARATUS

CROSS REFERENCE TO RELATED APPLICATIONS

This application is a continuation application of U.S. patent application Ser. No. 16/481,615 filed on Jul. 29, 2019, which is a U.S. National Phase of International Patent Application No. PCT/JP2018/001650 filed on Jan. 19, 2018, which claims priority benefit of Japanese Patent Application No. JP 2017-024413 filed in the Japan Patent Office on Feb. 13, 2017. Each of the above-referenced applications is hereby incorporated herein by reference in its entirety.

TECHNICAL FIELD

The present disclosure relates to a display device and an electronic apparatus.

BACKGROUND ART

In recent years, in a display device for use in a mobile device, a demand for higher definition and lower power consumption has increased.

For example, a display device using an organic electroluminescent element (organic electro-luminescence diode: OLED) disclosed in Patent Document 1 described below is self-luminous and has low power consumption, and therefore an application thereof for use in a mobile device has been expected.

However, in such an organic electroluminescent element, an organic light emitting layer is disposed in common to all light emitting elements, and therefore leakage of a drive current is likely to occur between adjacent light emitting elements. Therefore, for example, Patent Document 2 described below discloses a technique for suppressing leakage of a drive current occurring between adjacent light emitting elements by increasing resistance of a highly conductive layer (for example, a hole injection layer and a hole transport layer) in an organic light emitting layer in a region between light emitting elements.

CITATION LIST

Patent Document

Patent Document 1: Japanese Patent Application Laid-Open No. 2015-149194
Patent Document 2: Japanese Patent Application Laid-Open No. 2012-216338

SUMMARY OF THE INVENTION

Problems to be Solved by the Invention

However, with the technique disclosed in Patent Document 2 described above, it is difficult to sufficiently eliminate a highly conductive path that leaks a drive current in the organic light emitting layer. Therefore, in the display device disclosed in Patent Document 2 described above, it is difficult to sufficiently suppress leakage of a drive current between adjacent light emitting elements.

Therefore, the present disclosure proposes a novel and improved display device and electronic apparatus capable of further suppressing leakage of a drive current occurring between adjacent light emitting elements.

Solutions to Problems

The present disclosure provides a display device including: a plurality of light emitting elements having an organic light emitting layer sandwiched between a first electrode disposed for each of the light emitting elements and a second electrode in a lamination direction and arrayed on a plane; and an insulating layer disposed between the first electrodes, in which at least a part of a film thickness region in the insulating layer contains a positively charged inorganic nitride.

Furthermore, the present disclosure provides an electronic apparatus including a display unit including: a plurality of light emitting elements having an organic light emitting layer sandwiched between a first electrode disposed for each of the light emitting elements and a second electrode in a lamination direction and arrayed on a plane; and an insulating layer disposed between the first electrodes, in which at least a part of a film thickness region in the insulating layer contains a positively charged inorganic nitride.

The present disclosure can suppress generation of a highly conductive path that leaks a drive current in an organic light emitting layer.

Effects of the Invention

As described above, the present disclosure can suppress leakage of a drive current occurring between adjacent light emitting elements in a display device.

Note that the above effect is not necessarily limited. Any one of effects described in the present specification or another effect that can be grasped from the present specification may be exhibited together with the above effect or in place of the above effect.

MODE FOR CARRYING OUT THE INVENTION

Figure 1:
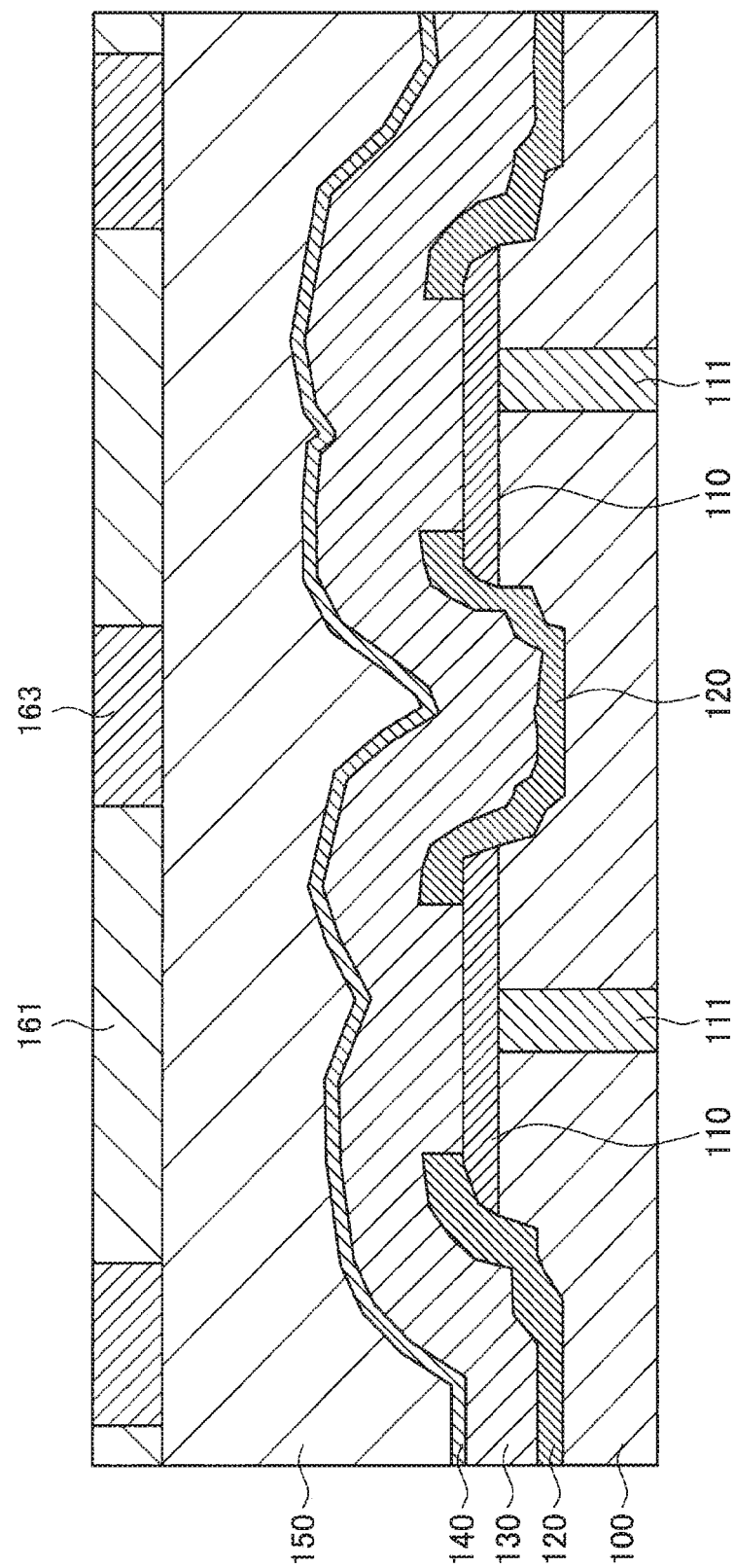
FIG. 1 is a cross-sectional view of a display device according to a first embodiment of the present disclosure, cut in a lamination direction.

Preferable embodiments of the present disclosure will be described in detail below with reference to the accompanying drawings. Note that in the present specification and the drawings, the same reference numerals are given to constituent elements having substantially the same functional configuration, and redundant explanation is omitted. Note that the description will be made in the following order.
1. First Embodiment
1.1. Configuration of display device
1.2. Method for manufacturing display device
2. Second Embodiment
2.1. Configuration of display device
2.2. Method for manufacturing display device
2.3. Modification
3. Application example of display device 1. First Embodiment

[1.1. Configuration of Display Device]
First, with reference to FIG. 1, a configuration of a display device according to a first embodiment of the present disclosure will be described. FIG. 1 is a cross-sectional view of the display device according to the first embodiment of the present disclosure, cut in a lamination direction.

The display device according to the present embodiment is a display device that displays an image or the like, for example, by controlling light emission of each of a plurality of light emitting elements arrayed on a plane. Each of the plurality of light emitting elements arrayed on a plane constitutes, for example, any one of red, green, and blue sub-pixels, and these three sub-pixels constitute one pixel (in other words, one pixel). The display device according to the present embodiment can control the color of each pixel by controlling light emission of the three sub-pixels constituting a pixel, and can display an image based on an image signal.

Note that, in the display device according to the present embodiment, any configuration can be used as a drive circuit that controls light emission of each of the light emitting elements, a power supply circuit that supplies power to the light emitting elements, or the like. Therefore, these configurations are not illustrated below.

As illustrated in FIG. 1, the display device according to the present embodiment includes a substrate 100, a contact plug 111 disposed inside the substrate 100, a first electrode 110 disposed on the substrate 100 for each of light emitting elements, an insulating layer 120 disposed between the first electrodes 110, an organic light emitting layer 130 disposed on the first electrode 110 and the insulating layer 120, a second electrode 140 disposed on the organic light emitting layer 130, a protective layer 150 disposed on the second electrode 140, and a color filter 161 and a shielding layer 163 disposed on the protective layer 150. In other words, the display device according to the present embodiment may be a top emission type display device that extracts light emitted by the light emitting elements from the protective layer 150 side.

The substrate 100 is a support that supports a plurality of light emitting elements arrayed on one main surface. Furthermore, although not illustrated, on the substrate 100, a drive circuit including a sampling transistor and a drive transistor that control driving of the light emitting elements, and a power supply circuit that supplies power to the light emitting elements may be disposed.

The substrate 100 may be constituted by, for example, a glass or a resin having low moisture and oxygen transmittance, or may be constituted by a semiconductor that easily forms a transistor or the like. Specifically, the substrate 100 may be a glass substrate such as a high strain point glass, a soda glass, a borosilicate glass, forsterite, a lead glass, or a quartz glass, a semiconductor substrate such as an amorphous silicon or a polycrystalline silicon, or a resin substrate such as polymethyl methacrylate, polyvinyl alcohol, polyvinyl phenol, polyether sulfone, polyimide, polycarbonate, polyethylene terephthalate, or polyethylene naphthalate.

The contact plug 111 electrically connects the first electrode 110 to a drive circuit, a power supply circuit, and the like. Specifically, the contact plug 111 electrically connects the first electrode 110 to a drive circuit, a power supply circuit, and the like (not illustrated) disposed inside the substrate 100, and applies power for light emission of the light emitting elements to the first electrode 110. The contact plug 111 may contain, for example, a single metal such as chromium (Cr), gold (Au), platinum (Pt), nickel (Ni), copper (Cu), molybdenum (Mo), tungsten (W), titanium (Ti), tantalum (Ta), aluminum (Al), iron (Fe), or silver (Ag), or an alloy thereof, or may be formed by laminating a plurality of films of these metals.

The first electrode 110 is disposed on the substrate 100 for each of the light emitting elements, and functions as an anode of each of the light emitting elements. Specifically, the first electrode 110 may be formed as a light reflecting electrode with a material having a high light reflectance and a large work function. For example, the first electrode 110 may contain a single metal such as Cr, Au, Pt, Ni, Cu, Mo, W, Ti, Ta, Al, Fe, or Ag, or an alloy thereof, or may be formed by laminating a plurality of films of these metals.

Furthermore, the first electrode 110 may be formed as a transparent electrode with a transparent conductive material such as indium zinc oxide or indium tin oxide. In such a case, between the first electrode 110 and the substrate 100, a light reflecting layer containing a single metal such as Cr, Au, Pt, Ni, Cu, Mo, W, Ti, Ta, Al, Fe, or Ag, or an alloy thereof may be disposed.

The insulating layer 120 is disposed between the adjacent first electrodes 110 to separate the light emitting elements from each other. Specifically, the insulating layer 120 may be formed so as to cover a side surface of the first electrode 110 in order not to expose the side surface of the first electrode 110.

On the side surface of the first electrode 110, the film thickness of the organic light emitting layer 130 tends to be thin. Therefore, a drive voltage tends to be applied locally thereto, and abnormal light emission tends to occur. Furthermore, in a case where the first electrode 110 is formed as a laminated film of a plurality of metal films, the metal films have different work functions from one another. Therefore, the side surface of the first electrode 110 where each of the metal films is exposed tends to cause abnormal light emission. Therefore, by covering the side surface of the first electrode 110 with the insulating layer 120, it is possible to prevent occurrence of abnormal light emission.

Furthermore, at least a part of a film thickness region in the insulating layer 120 contains an inorganic nitride and is positively charged. More specifically, at least a part of a film thickness region in the insulating layer 120 may contain an inorganic nitride containing no oxygen atom. As a result, as described later, the insulating layer 120 can suppress generation of a highly conductive path that causes leakage of a drive current in the organic light emitting layer 130.

Figure 2:
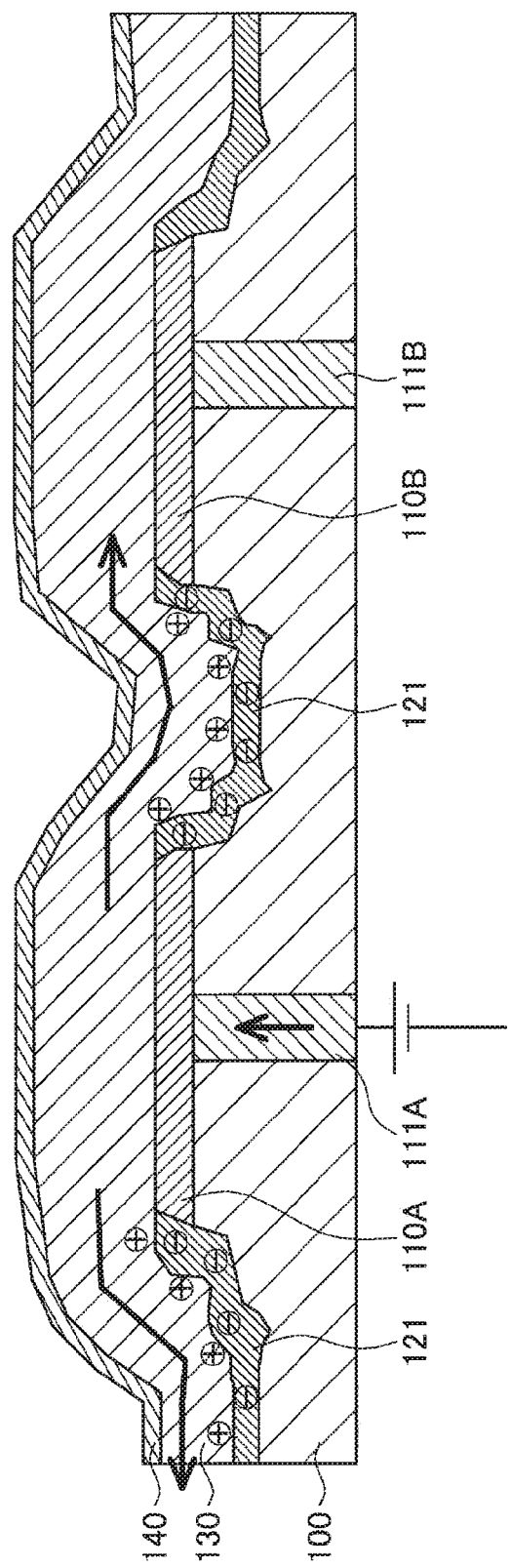
FIG. 2 is a cross-sectional view for explaining leakage of a drive current in an organic light emitting layer.

Here, in the organic light emitting layer 130, a mechanism in which a highly conductive path causing leakage of a drive current is generated will be described with reference to FIG. 2. FIG. 2 is a cross-sectional view for explaining leakage of a drive current in the organic light emitting layer 130.

In FIG. 2, the insulating layer 121 contains, for example, an inorganic oxide (for example, silicon oxide) which is a general insulating material. In such an insulating layer 121, hydrogen is bonded to unstable oxygen contained in the inorganic oxide to generate a hydroxy group. Since the hydroxy group has a negative charge, many hydroxy groups formed in the insulating layer 121 negatively charge the insulating layer 121. As a result, the negatively charged insulating layer 121 attracts a hole having a positive charge to an interface of the organic light emitting layer 130 in contact with the insulating layer 121.

Meanwhile, the organic light emitting layer 130 on a side in contact with the insulating layer 121 is, for example, a hole transport layer, and has a high hole mobility. Therefore, holes attracted by the negatively charged insulating layer 121 and accumulated easily form a highly conductive path at the interface of the organic light emitting layer 130 in contact with the insulating layer 121. Therefore, in a case where the insulating layer 121 contains an inorganic oxide, a drive current applied to the first electrode 110 passes through a path formed at the interface of the organic light emitting layer 130 in contact with the insulating layer 121 and easily leaks to the first electrode 110 of an adjacent light emitting element.

In particular, an inorganic oxide film formed using low-temperature plasma is relatively weak in bonding between atoms and easily generates a defect, and therefore easily generates unstable oxygen to form a hydroxy group. Therefore, in a case where the insulating layer 121 is formed by chemical vapor deposition (CVD) using low-temperature plasma, atomic layer deposition (ALD), or the like, a highly conductive path is easily formed, and leakage of a drive current easily occurs at the interface of the organic light emitting layer 130.

In the display device according to the present embodiment, as illustrated in FIG. 1, the insulating layer 120 contains an inorganic nitride and is positively charged. Therefore, a hole is not attracted to the interface of the organic light emitting layer 130 in contact with the insulating layer 120. Therefore, a path through which a leak current flows is hardly formed in the organic light emitting layer 130 in contact with the insulating layer 120. Therefore, the display device according to the present embodiment can prevent leakage of a drive current between the first electrodes 110.

This is because bond energy between atoms in an inorganic nitride is higher than bond energy between atoms in an inorganic oxide, and the insulating layer 120 containing an inorganic nitride hardly generates a defect in an atomic bond that is a basis for generating a hydroxy group, for example. Furthermore, another reason is that the insulating layer 120 containing an inorganic nitride does not contain oxygen and hardly generates a hydroxy group. Therefore, by using an inorganic nitride, it is possible to form the insulating layer 120 not negatively charged but positively charged.

Specifically, the insulating layer 120 can contain silicon nitride ($SiN_x$) or the like. Furthermore, in order to charge the insulating layer 120 more positively, a ratio of Si—H/N—H of a silicon nitride forming the insulating layer 120 may be less than 1%.

A film of silicon nitride is formed, for example, by reacting a Si-containing gas (for example, $SiH_4$) and a N-containing gas (for example, $NH_3$) by CVD or the like. Therefore, the silicon nitride film contains a hydrogen atom contained in the source gases. At this time, as the ratio of Si—H/N—H is smaller and the amount of hydrogen atoms contained in the silicon nitride film is smaller, a hydroxyl group is less likely to be generated. Therefore, by using silicon nitride in which the ratio of Si—H/N—H is less than 1%, it is possible to form the insulating layer 120 more strongly positively charged. Such an insulating layer 120 with a small content of hydrogen atoms can be formed, for example, by controlling a flow rate of source gases such that the number of hydrogen atoms contained in the source gases in CVD is small.

Note that the method for forming the insulating layer 120 that is positively charged and does not attract a hole to the interface with the organic light emitting layer 130 is not limited to the method described above. For example, the positively charged insulating layer 120 can also be formed by doping a layer containing an insulating material other than an inorganic nitride with a nitrogen atom, a fluorine atom, or the like.

Moreover, the insulating layer 120 may be formed, for example, as a multilayer laminated film with a plurality of insulating films. In such a case, at least one of the plurality of insulating films constituting the insulating layer 120 is formed as a film positively charged with an inorganic nitride.

For example, the insulating layer 120 may be formed as a multilayer film obtained by laminating a film containing an inorganic nitride and a film containing an inorganic oxide from the substrate 100 side. In such a case, even if the film containing an inorganic oxide is in contact with the organic light emitting layer 130, the film containing an inorganic nitride is positively charged, and therefore can cancel a negative charge generated in the film containing an inorganic oxide. As a result, the film containing an inorganic nitride can prevent the entire insulating layer 120 from being negatively charged, and therefore can prevent generation of a highly conductive path in the organic light emitting layer 130.

However, the film containing an inorganic nitride may be disposed on a side of the insulating layer 120 in contact with the organic light emitting layer 130. In such a case, the film containing an inorganic nitride can positively charge a surface of the insulating layer 120, and therefore can reliably suppress generation of a highly conductive path at an interface of the organic light emitting layer 130 in contact with the insulating layer 120.

As described above, in a case where the insulating layer 120 is constituted by a plurality of insulating films, characteristics required as the insulating layer 120 can be controlled for each of the insulating films. For example, it is possible to select each of the plurality of insulating films constituting the insulating layer 120 in consideration of stability of an interface between the organic light emitting layer 130 and the insulating layer 120 and an interface between the substrate 100 and the insulating layer 120. Furthermore, when the insulating layer 120 is patterned using etching or the like, by constituting the insulating layer 120 by a plurality of insulating films having different etching resistances, progress of etching can be easily controlled. Therefore, in a case where the insulating layer 120 is constituted by a plurality of insulating films, productivity of the display device can also be improved.

The organic light emitting layer 130 contains an organic light emitting material, and is disposed on the first electrode 110 and the insulating layer 120 as a continuous film common to all the light emitting elements. Furthermore, the organic light emitting layer 130 emits light by application of an electric field between the first electrode 110 and the second electrode 140.

Specifically, in a case where an electric field is applied, into the organic light emitting layer 130, a hole is injected from the first electrode 110, and an electron is injected from the second electrode 140. The injected hole and electron recombine in the organic light emitting layer 130 to form an exciton, and energy of the exciton excites an organic light emitting material to generate fluorescence or phosphorescence from the organic light emitting material.

Here, the organic light emitting layer 130 may have a multilayer structure obtained by laminating a plurality of functional layers. For example, the organic light emitting layer 130 may have a structure formed by sequentially laminating a hole injection layer, a hole transport layer, a light emitting layer, an electron transport layer, and an electron injection layer from the first electrode 110 side. Furthermore, the organic light emitting layer 130 may have a so-called tandem structure in which a plurality of light emitting layers is connected to one another via a charge generation layer or an intermediate electrode.

The hole injection layer and the hole transport layer are layers that contain a hole transport material and enhance injection efficiency of a hole from the first electrode 110.

Examples of the hole transport material include benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, and derivatives thereof.

Specific examples of the hole transport material include α-naphthylphenylphenylenediamine (α-NPD), porphyrin, metal tetraphenylporphyrin, metal naphthalocyanine, hexacyanoazatriphenylene (HAT), 7,7,8,8-tetracyanoquinodimethane (TCNQ), 7,7,8,8-tetracyano-2,3,5,6-tetrafluoroquinodimethane (F4-TCNQ), tetracyano 4,4,4-tris(3-methylphenylphenylamino) triphenylamine, N,N,N',N'-tetrakis(p-tolyl) p-phenylenediamine, N,N,N',N'-tetraphenyl-4,4'-diaminobiphenyl, N-phenylcarbazole, and 4-di-p-tolylamino stilbene.

The light emitting layer is a layer that contains at least one or more of a hole transport material, an electron transport material, or a both charge transport material as host materials, and a fluorescent or phosphorescent organic light emitting material as a dopant material, and converts electric energy into light energy.

Examples of the host material include a styryl derivative, an anthracene derivative, a naphthacene derivative, a carbazole derivative, an aromatic amine derivative, a phenanthroline derivative, a triazole derivative, a quinolinolato-based metal complex, and a phenanthroline derivative.

Furthermore, examples of the dopant material (organic light emitting material) include a known fluorescent material and phosphorescent material. Examples of the known fluorescent material include a dye material such as a styryl benzene-based dye, an oxazole-based dye, a perylene-based dye, a coumarin-based dye, or an acridine-based dye, a polyaromatic hydrocarbon-based material such as an anthracene derivative, a naphthacene derivative, a pentacene derivative, or a chrysene derivative, a pyrromethene skeleton material, a quinacridone-based derivative, a cyanomethylenepyran-based derivative, a benzothiazole-based derivative, a benzimidazole-based derivative, and a metal chelated oxinoid compound. Furthermore, examples of the known phosphorescent material include an organometallic complex containing at least one metal selected from the group consisting of ruthenium (Ru), rhodium (Rh), palladium (Pd), silver (Ag), rhenium (Re), osmium (Os), iridium (Ir), platinum (Pt), and gold (Au). Specific examples of the phosphorescent material include a complex having a noble metal element such as Ir as a central metal, such as $Ir(ppy)_3$, a complex such as $Ir(bt)_2.acac_3$, and a complex such as $PtOEt_3$.

Furthermore, the light emitting layer may emit light corresponding to each color of the display device in place of white. For example, a red light emitting layer that emits red light can be formed by mixing 30% by mass of 2,6-bis[(4'-methoxydiphenylamino) styryl]-1,5-dicyanonaphthalene (BSN) with 4,4-bis(2,2-diphenylvinin) biphenyl (DPVBi) Furthermore, a green light emitting layer that emits green light can be formed by mixing 5% by mass of coumarin 6 with DPVBi. Moreover, a blue light emitting layer that emits blue light can be formed by mixing 2.5% by mass of 4,4'-bis[2-{4-(N,N-diphenylamino) phenyl} vinyl] biphenyl (DPAVBi) with DPVBi.

The electron transport layer is a layer that contains an electron transport material and enhances injection efficiency of an electron from the second electrode 140.

Examples of the electron transport material include tris (8-quinolinolato) aluminum ($Alq_3$) and a compound having a nitrogen-containing aromatic ring. Specific examples of the electron transport material include the above tris(8-quinolinolato) aluminum ($Alq_3$), 2,9-dimethyl-4,7-diphenyl-1,10-phenanthroline (BCP), and bathophenanthroline (Bphen). Note that the electron transport layer may be constituted by a plurality of layers. In a case where the electron transport layer is constituted by a plurality of layers, the electron transport layer may contain a layer further doped with an alkali metal element or an alkaline earth metal element.

The electron injection layer is a layer that enhances injection efficiency of an electron from the second electrode 140. The electron injection layer may contain, for example, lithium fluoride (LiF), sodium chloride (NaCl), cesium fluoride (CsF), lithium oxide ($Li_2O$), or barium oxide (BaO).

The second electrode 140 functions as a cathode of the light emitting elements, and is disposed on the organic light emitting layer 130 as a continuous film common to all the light emitting elements. Specifically, the second electrode 140 may be formed as a light transmitting electrode with a material having high light transmittance and a small work function. For example, the second electrode 140 may contain a transparent conductive material such as indium tin oxide, indium zinc oxide, zinc oxide, aluminum-doped zinc oxide, or gallium-doped zinc oxide, and may be formed as a thin film having a thin thickness (for example, 30 nm or less) to a degree to which light transmits with an alloy of a metal such as aluminum (Al), magnesium (Mg), silver (Ag), calcium (Ca), or sodium (Na). Furthermore, the second electrode 140 may be formed by laminating a plurality of films containing the above metal or alloy.

The protective layer 150 is disposed on the second electrode 140 to prevent moisture and oxygen from entering the organic light emitting layer 130. Furthermore, the protective layer 150 improves the mechanical strength of the display device. Specifically, the protective layer 150 may contain a material having high light transmittance and low water transmittance. For example, the protective layer 150 may contain silicon oxide ($SiO_x$), silicon nitride ($SiN_x$), aluminum oxide ($AlO_x$), or a combination thereof.

The color filter 161 and the shielding layer 163 define a pixel or a sub-pixel of the display device. For example, the color filter 161 may be a red filter, a green filter, or a blue filter. The color filter 161 can divide light emitted from the light emitting elements by color and extract the light. The color filter 161 may contain, for example, a resin containing a pigment or a dye.

Furthermore, the shielding layer 163 is a so-called black matrix, and is patterned in a matrix in accordance with arrangement of pixels or sub-pixels of the display device. The shielding layer 163 can improve contrast of the display device by shielding unnecessary external light or the like reflected by wiring or the like between pixels or sub-pixels. The shielding layer 163 may contain, for example, a black material such as chromium (Cr) or graphite.

As described above, in the display device according to the present embodiment, by disposing the insulating layer 120 in which a part of the film thickness region is positively charged, it is possible to suppress formation of a path in which the conductivity is increased by accumulating holes in the organic light emitting layer 130. Therefore, the display device according to the present embodiment can suppress occurrence of leakage of a drive current between the first electrodes 110 of adjacent light emitting elements.

[1.2. Method for Manufacturing Display Device]

Subsequently, a method for manufacturing the display device according to the present embodiment will be described with reference to FIGS. 3 to 7. FIGS. 3 to 7 are cross-sectional views illustrating steps of the method for manufacturing the display device according to the present embodiment.

Figure 3:
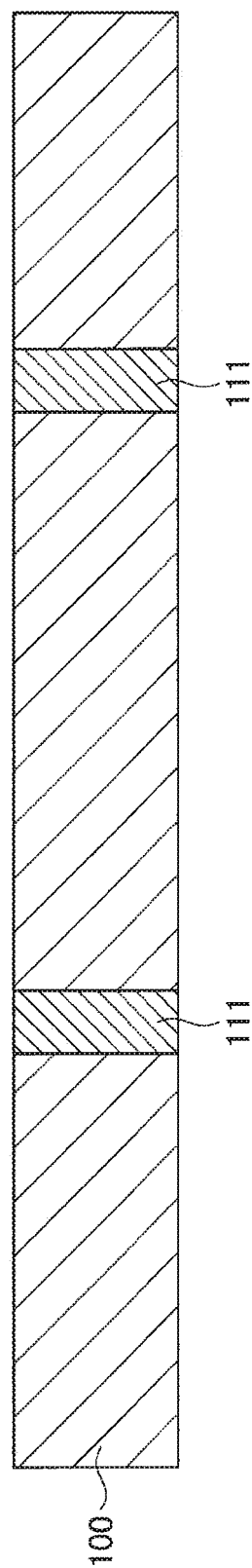
FIG. 3 is a cross-sectional view illustrating one step of a method for manufacturing the display device according to the first embodiment.

First, as illustrated in FIG. 3, the substrate 100 in which a drive circuit (not illustrated), a power supply circuit (not illustrated), and the contact plug 111 electrically connected to these circuits are formed is prepared. For example, the substrate 100 may be a silicon substrate that easily forms a transistor or the like.

Figure 4:
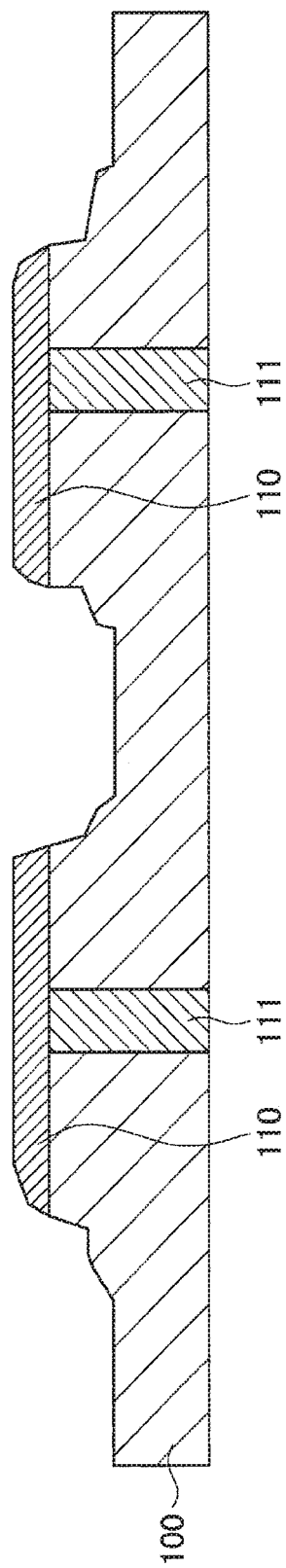
FIG. 4 is a cross-sectional view illustrating one step of the method for manufacturing the display device according to the first embodiment.

Next, as illustrated in FIG. 4, the first electrode 110 is formed for each of the light emitting elements on the substrate 100 so as to be connected to the contact plug 111 using sputtering or the like. For example, the first electrode 110 may contain an aluminum copper alloy (AlCu), or may be constituted by a multilayer film obtained by sequentially laminating an aluminum copper alloy (AlCu) and indium tin oxide from the substrate 100 side.

At this time, a region between the first electrodes 110 of the light emitting elements may be dug by etching or the like. As a result, the first electrodes 110 are more reliably separated from one another, and therefore separation performance of each of the light emitting elements can be improved.

Figure 5:
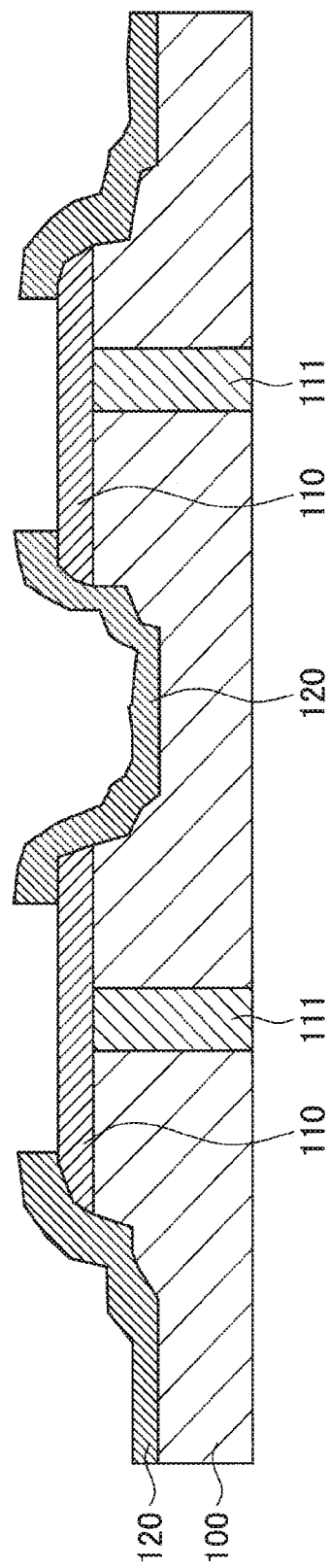
FIG. 5 is a cross-sectional view illustrating one step of the method for manufacturing the display device according to the first embodiment.

Subsequently, as illustrated in FIG. 5, the insulating layer 120 is formed between the first electrodes 110 using CVD or the like. Specifically, the insulating layer 120 is first formed on the entire surface of the substrate 100, and then an opening is formed using etching or the like such that an upper surface of the first electrode 110 is exposed. As a result, the insulating layer 120 can be formed so as to cover a side surface of the first electrode 110.

Here, in a case where the first electrode 110 contains a transparent conductive material such as indium tin oxide, it may be difficult to remove an organic substance such as a resist from a top of the indium tin oxide after etching. Therefore, in such a case, after etching of the insulating layer 120 proceeds halfway, by removing a resist and then etching (so-called etching back) the entire surface uniformly, the insulating layer 120 may be patterned. In a case where it is required to precisely control the progress of etching as described above, the insulating layer 120 may be formed as a multilayer film obtained by laminating a plurality of insulating films having different etching resistances For example, the insulating layer 120 may be constituted by a single layer of silicon nitride ($SiN_x$), or may be constituted by a laminated film of silicon oxide ($SiO_x$) and silicon nitride ($SiN_x$). In a case where the insulating layer 120 is constituted by a laminated film of silicon oxide and silicon nitride, either film may be in contact with the organic light emitting layer 130. However, in order to further suppress leakage of a drive current, a film containing silicon nitride is desirably in contact with the organic light emitting layer 130.

Figure 6:
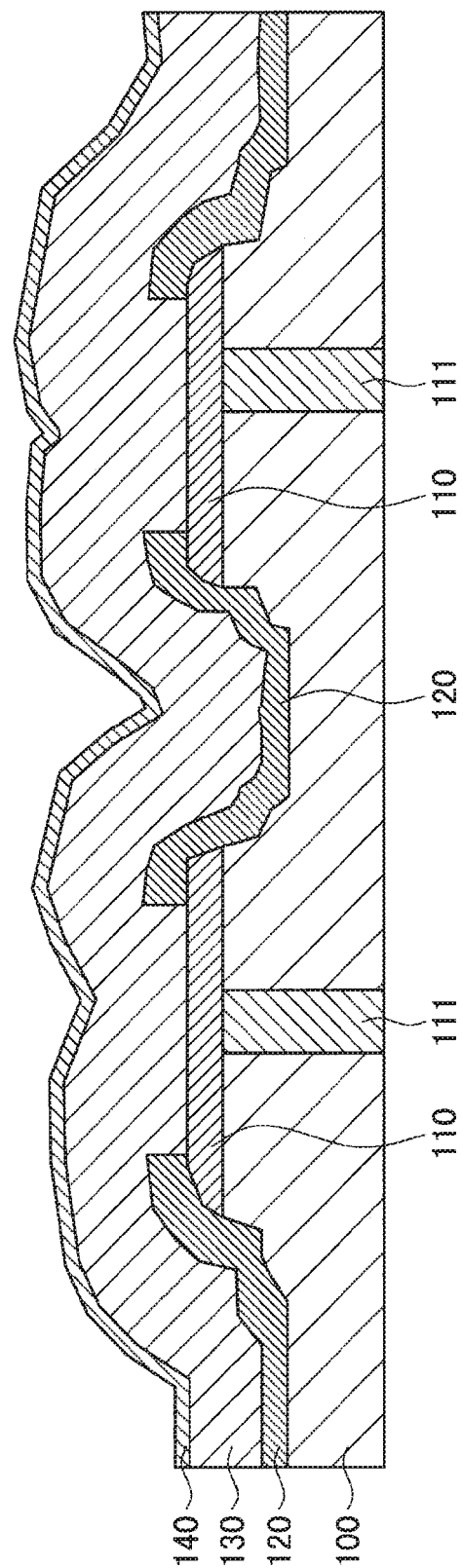
FIG. 6 is a cross-sectional view illustrating one step of the method for manufacturing the display device according to the first embodiment.

Subsequently, as illustrated in FIG. 6, the organic light emitting layer 130 and the second electrode 140 are sequentially formed on the entire surface of the first electrode 110 and the insulating layer 120. For example, the organic light emitting layer 130 may be formed by sequentially forming a hole injection layer, a hole transport layer, a light emitting layer, an electron transport layer, a light emitting layer, an electron transport layer, and an electron injection layer from the first electrode 110 side using a vacuum vapor deposition method or the like. For example, the materials described above can be used for materials of the layers constituting the organic light emitting layer 130. Furthermore, the second electrode 140 may also be formed by forming a film of a transparent conductive material such as indium zinc oxide or indium tin oxide using sputtering or the like.

Figure 7:
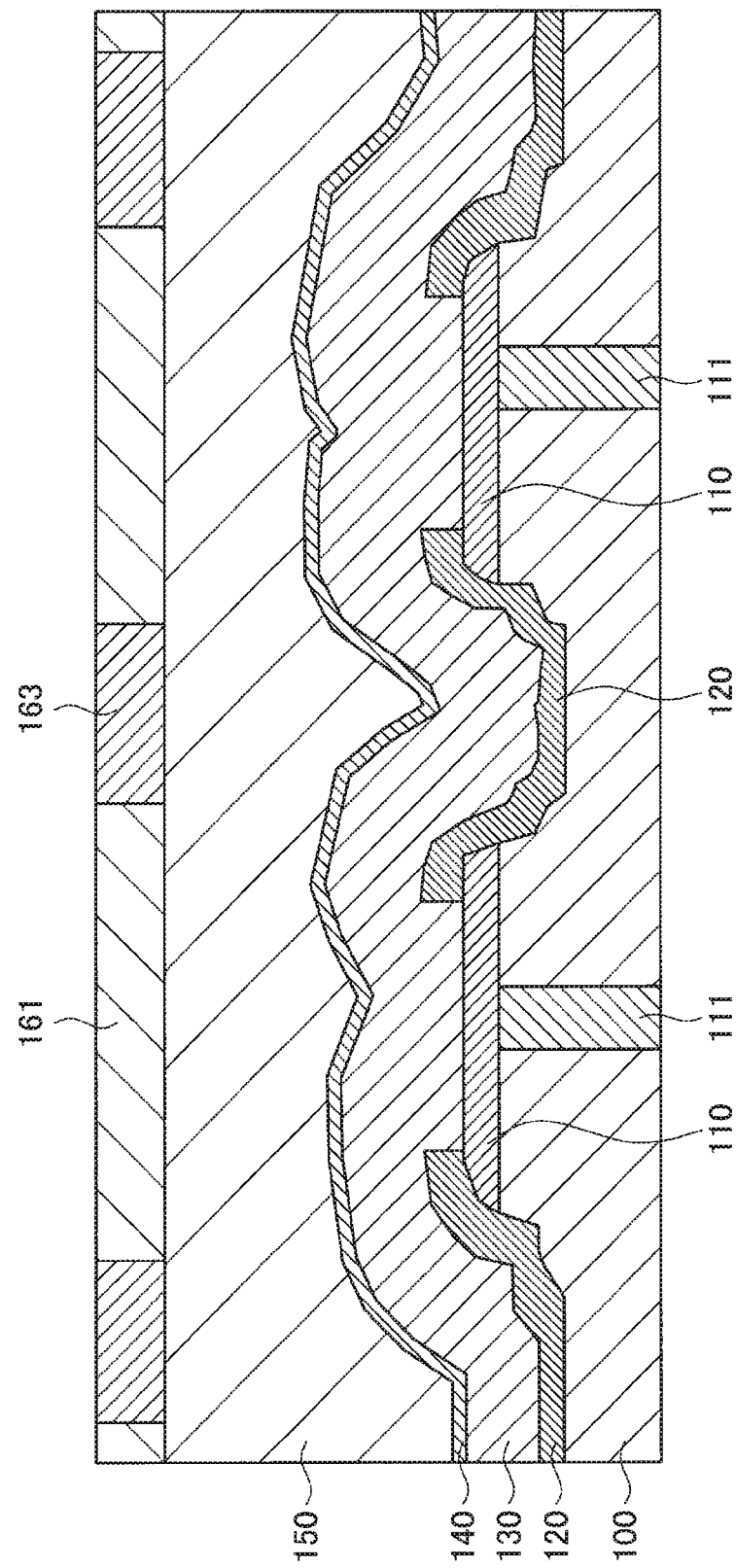
FIG. 7 is a cross-sectional view illustrating one step of the method for manufacturing the display device according to the first embodiment.

Next, as illustrated in FIG. 7, the protective layer 150 is formed on the second electrode 140 using CVD or the like. For example, the protective layer 150 may contain silicon oxide ($SiO_x$), silicon nitride ($SiN_x$), or silicon oxynitride (SiON).

Moreover, by performing patterning using photolithography or the like, the color filter 161 and the shielding layer 163 are formed on the protective layer 150. Specifically, first, the shielding layer 163 is formed on the entire surface of the protective layer 150, and then patterning is performed for each pixel or sub-pixel using photolithography or the like to form an opening in the shielding layer 163. Thereafter, by forming the color filter 161 corresponding to each color in the opening of the shielding layer 163, the color filter 161 and the shielding layer 163 can be formed.

The display device according to the present embodiment can be manufactured through the above steps. Note that the above manufacturing method is merely an example, and the method for manufacturing the display device according to the present embodiment is not limited to the above.

2. Second Embodiment

[2.1. Configuration of Display Device]

Figure 8:
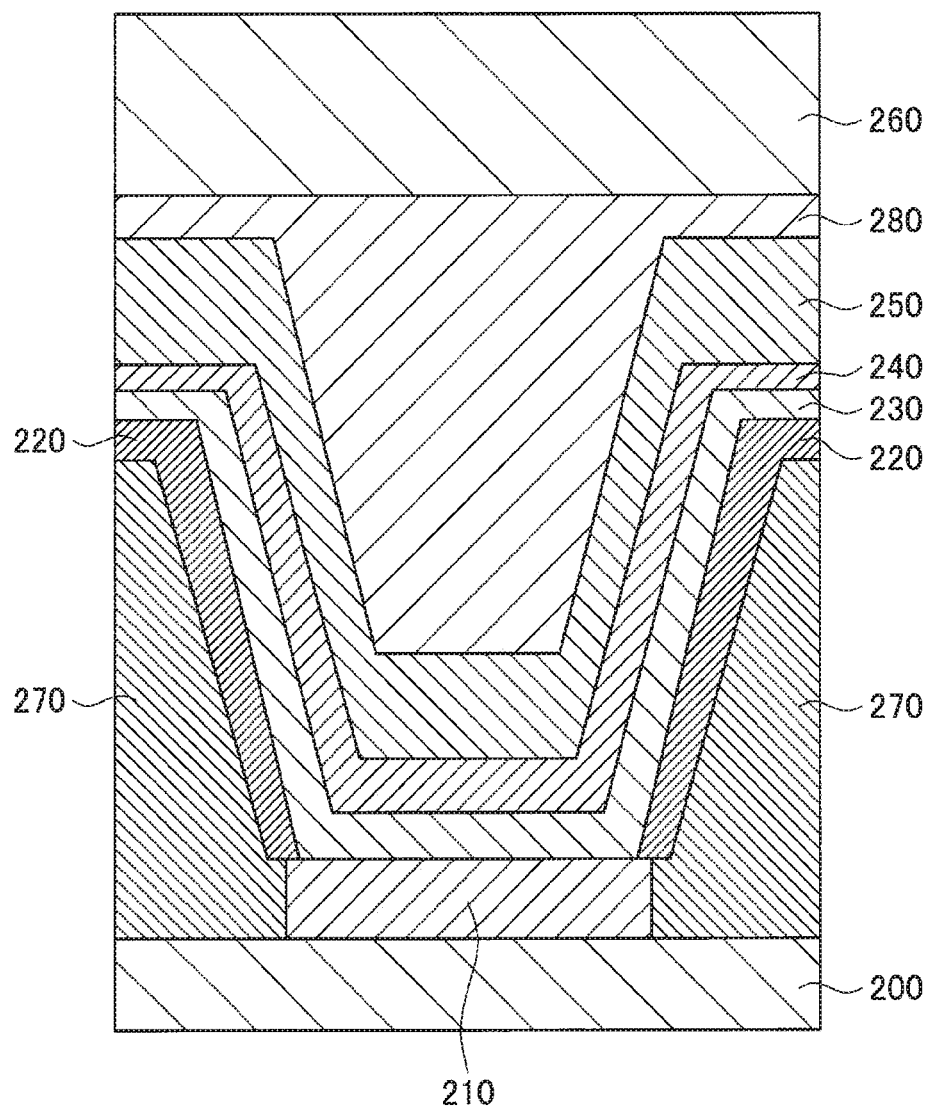
FIG. 8 is a cross-sectional view of a display device according to a second embodiment of the present disclosure, cut in a lamination direction.

Next, with reference to FIG. 8, a configuration of a display device according to a second embodiment of the present disclosure will be described. FIG. 8 is a cross-sectional view of the display device according to the second embodiment of the present disclosure, cut in a lamination direction.

As illustrated in FIG. 8, the display device according to the present embodiment includes a substrate 200, a first electrode 210 disposed on the substrate 200, a first member 270 forming a recess structure having the first electrode 210 as a bottom, an insulating layer 220 disposed along the first member 270, an organic light emitting layer 230 disposed on the first electrode 210 and the insulating layer 220, a second electrode 240 disposed on the organic light emitting layer 230, a protective layer 250 disposed on the second electrode 240, a second member 280 disposed on the protective layer 250 and having the recess structure embedded therein, and a color filter 260 disposed on the second member 280.

In other words, in the display device according to the present embodiment, a light emitting element is formed inside the recess structure having the first electrode 210 as a bottom and having the first member 270 disposed between the light emitting elements as a side wall. Furthermore, in the display device according to the present embodiment, the recess structure having a light emitting element therein is embedded by the second member 280 having a larger refractive index than the first member 270. As a result, the first member 270 and the second member 280 can function as a light reflecting portion that reflects incident light because a magnitude relationship of the refractive index satisfies the condition of total reflection. Therefore, the display device according to the present embodiment can improve the light extraction efficiency from a light emitting element by forming the light emitting element inside the recess structure and causing a side wall of the recess structure to function as a light reflecting portion.

Note that among the components illustrated in FIG. 8, description of a specific material of a component having the same name as each of the components illustrated in FIG. 1 is substantially similar to that in FIG. 1, and therefore detailed description thereof is omitted here.

The substrate 200 is a support that supports a plurality of light emitting elements arrayed on one main surface. Although not illustrated, on the substrate 200, a drive circuit that controls driving of the light emitting elements, a power supply circuit that supplies power to the light emitting elements, and a contact plug that electrically connects these circuits to the first electrode 210 may be disposed.

The first electrode 210 is disposed on the substrate 200 for each of the light emitting elements, and functions as an anode of each of the light emitting elements. Furthermore, the first electrode 210 is disposed at a bottom of the recess structure having the first member 270 as a side wall. Specifically, the first electrode 210 may be formed as a light reflecting electrode with a material having a high light reflectance and a large work function.

The first member 270 is disposed between the light emitting elements on the substrate 200 to separate the light emitting elements from each other. Specifically, the first member 270 is formed around the first electrode 210 in a substantially trapezoidal shape (in other words, a tapered shape) having an inclined portion. As a result, the first member 270 can form a recess structure (in other words, an inversely tapered shape) having the first electrode 210 as a bottom and having the opposite side to the substrate 200 open. The first member 270 may contain a low refractive index material having a smaller refractive index than the second member 280. The first member 270 may be formed by, for example, an organic insulating film such as a polyimide-based resin, an acrylic resin, or a novolac-based resin, or an inorganic insulating film such as silicon oxide ($SiO_x$), silicon nitride ($SiN_x$), or silicon oxynitride (SiON).

The insulating layer 220 is disposed along the first member 270 between the adjacent first electrodes 210. Furthermore, at least a part of a film thickness region in the insulating layer 220 contains a positively charged inorganic nitride. As a result, the insulating layer 220 can suppress generation of a highly conductive path in the organic light emitting layer 230, and therefore can suppress leakage of a drive current.

The organic light emitting layer 230 contains an organic light emitting material, and is disposed on the first electrode 210 and the insulating layer 220 along the recess structure as a continuous film common to all the light emitting elements. For example, the organic light emitting layer 230 may have a structure in which a hole injection layer, a hole transport layer, a light emitting layer, an electron transport layer, and an electron injection layer are sequentially laminated from the first electrode 210 side.

The second electrode 240 functions as a cathode of the light emitting elements, and is disposed on the organic light emitting layer 230 along the recess structure as a continuous film common to all the light emitting elements. Specifically, the second electrode 240 may be formed as a light transmitting electrode with a material having high light transmittance and a small work function.

The protective layer 250 is disposed on the second electrode 240 to prevent moisture and oxygen from entering the organic light emitting layer 230. Furthermore, in order to increase the light reflecting efficiency of the protective layer 250 due to a difference in refractive index between the first member 270 and the second member 280, at least the refractive index of the protective layer 250 on a side in contact with the second member 280 is desirably large. For example, the protective layer 250 may be formed by a multilayer film obtained by sequentially laminating a layer containing silicon nitride ($SiN_x$) or silicon oxide ($SiO_x$) and a laminated film containing $AlO_x$ and $TiO_x$ having a large refractive index from the second electrode 240 side.

The second member 280 is disposed on the protective layer 250 so as to embed the recess structure formed by the first member 270. The second member 280 contains a high refractive index material having a refractive index larger than the first member 270. The second member 280 may be formed by, for example, a transparent organic insulating film such as a polyimide-based resin, an acrylic resin, or a novolac-based resin, or a transparent inorganic insulating film such as silicon oxide ($SiO_x$), silicon nitride ($SiN_x$), or silicon oxynitride (SiON). As a result, the first member 270 and the second member 280 can function as a light reflecting portion that reflects light emitted from the light emitting elements, and therefore can improve the light extraction efficiency of the light emitting elements.

Note that the second member 280 having a larger refractive index can be formed, for example, by using a resin containing many substituents having high molecular refraction, such as a sulfur-containing substituent, a phosphorus-containing substituent, or an aromatic ring, in a molecular structure thereof. Furthermore, the second member 280 having a larger refractive index can also be formed by incorporating a high refractive index inorganic filler such as $TiO_x$ or $ZrO_x$ into the second member 280.

The color filter 260 defines the color of a pixel or sub-pixel of the display device. For example, the color filter 260 may be a red filter, a green filter, or a blue filter. The color filter 260 can divide light emitted from the light emitting elements by color and extract the light. Note that a shielding layer which is a black matrix may be disposed in place of the color filter 260 in a region other than the pixels.

As described above, the display device according to the present embodiment can improve the light extraction efficiency of a light emitting element by forming the light emitting element inside the recess structure and causing a side wall of the recess structure to function as a light reflecting portion. Furthermore, even in such a case, by disposing the insulating layer 220 positively charged by an inorganic nitride along the first member 270 between the adjacent first electrodes 210, it is possible to suppress occurrence of leakage of a drive current between the first electrodes 210 of adjacent light emitting elements.

[2.2. Method for Manufacturing Display Device]

Next, a method for manufacturing the display device according to the present embodiment will be described with reference to FIGS. 9 to 15. FIGS. 9 to 15 are cross-sectional views illustrating steps of the method for manufacturing the display device according to the present embodiment.

Figure 9:
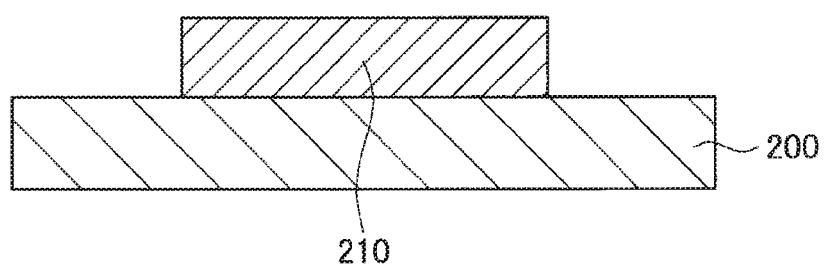
FIG. 9 is a cross-sectional view illustrating one step of a method for manufacturing the display device according to the second embodiment.

First, as illustrated in FIG. 9, the first electrode 210 is formed using sputtering or the like on the substrate 200 in which a drive circuit, a power supply circuit, and a contact plug (not illustrated) electrically connected to these circuits are formed. For example, the substrate 200 may be a silicon substrate that easily forms a transistor or the like. Furthermore, the first electrode 210 may contain an aluminum copper alloy (AlCu), or may be constituted by a multilayer film obtained by sequentially laminating an aluminum copper alloy (AlCu) and indium tin oxide from the substrate 200 side.

Figure 10:
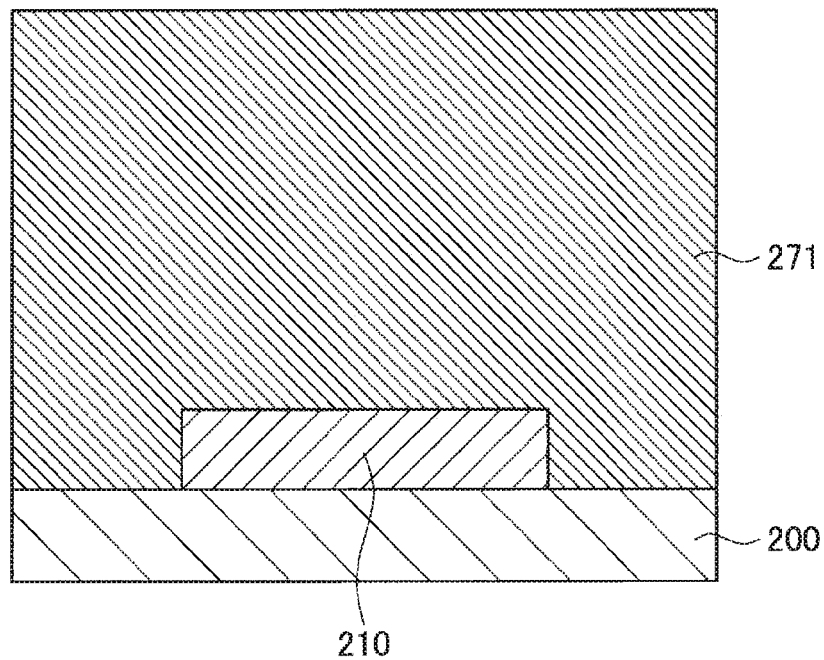
FIG. 10 is a cross-sectional view illustrating one step of the method for manufacturing the display device according to the second embodiment.

Next, as illustrated in FIG. 10, a first member layer 271 is formed on the substrate 200 and the first electrode 210 using CVD or the like. The first member layer 271 is a layer on which the first member 270 is formed by being patterned by etching in a later stage, and may contain, for example, silicon oxide ($SiO_x$).

Figure 11:
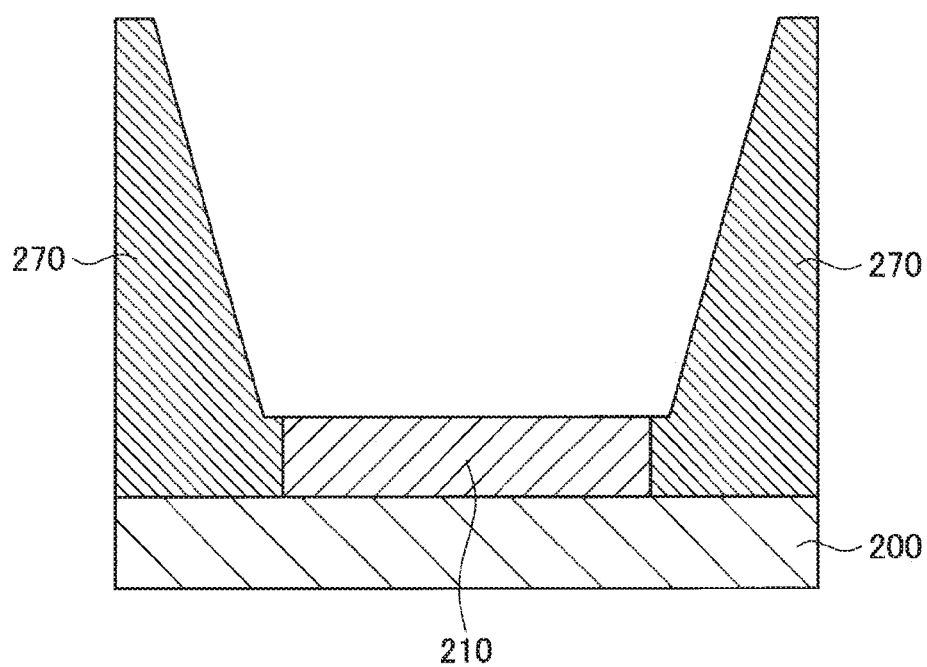
FIG. 11 is a cross-sectional view illustrating one step of the method for manufacturing the display device according to the second embodiment.

Subsequently, as illustrated in FIG. 11, the first member layer 271 is patterned so as to expose the first electrode 210 using etching or the like to form the recess structure having the first electrode 210 as a bottom and having the first member 270 as a side wall.

Figure 12:
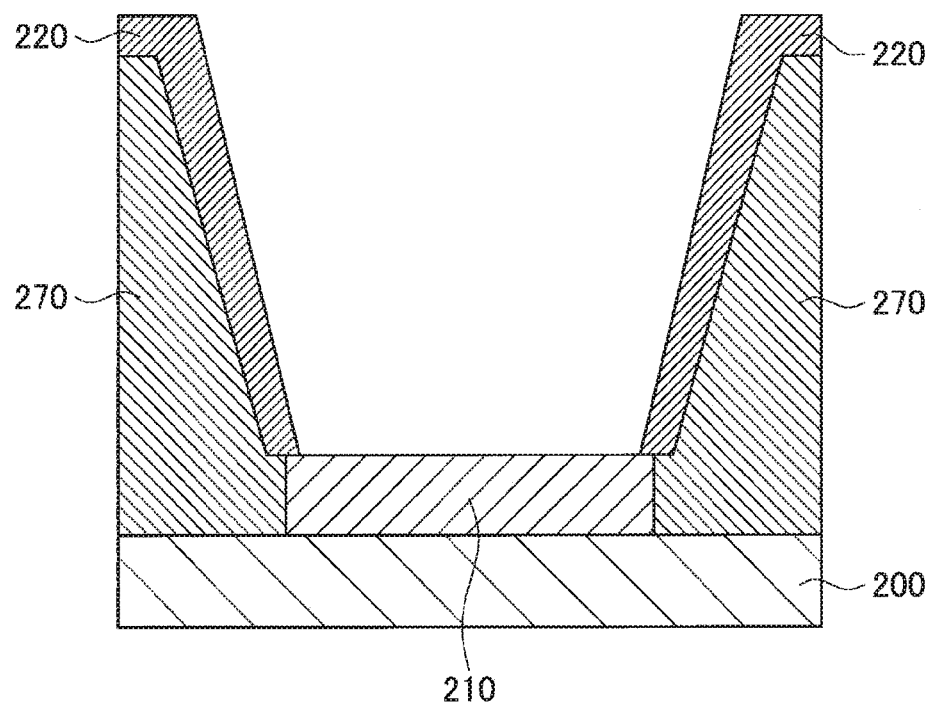
FIG. 12 is a cross-sectional view illustrating one step of the method for manufacturing the display device according to the second embodiment.

Next, as illustrated in FIG. 12, the insulating layer 120 is formed between the first electrodes 210 along the first member 270 using CVD or the like. For example, the insulating layer 220 may contain silicon nitride ($SiN_x$).

Figure 13:
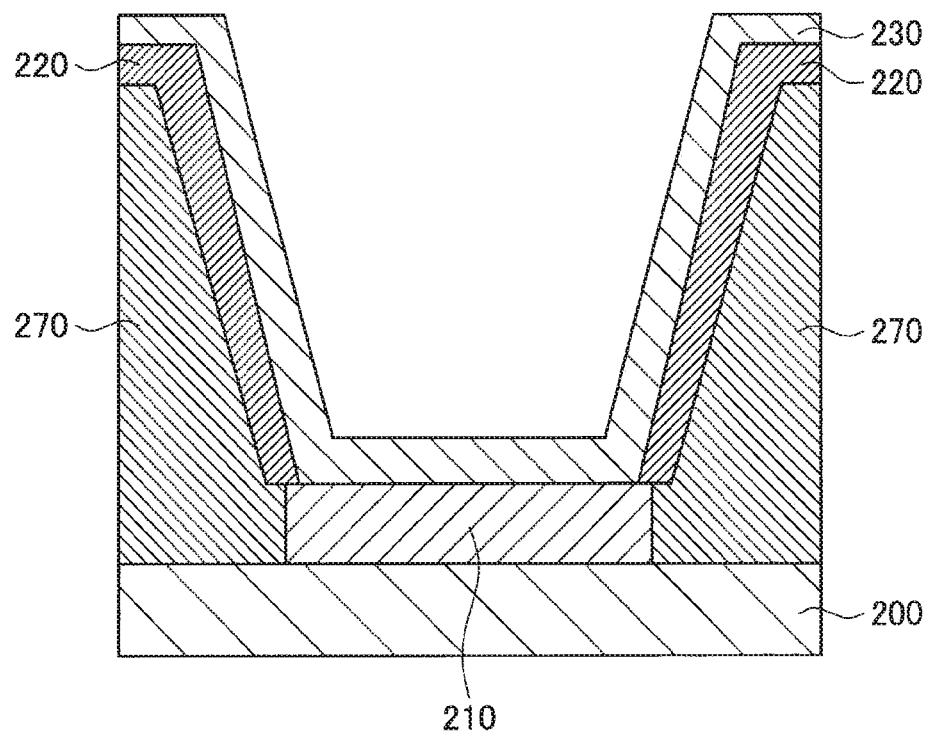
FIG. 13 is a cross-sectional view illustrating one step of the method for manufacturing the display device according to the second embodiment.

Subsequently, as illustrated in FIG. 13, the organic light emitting layer 230 is formed along the recess structure on the first electrode 210 and the insulating layer 220 using a vacuum vapor deposition method or the like. For example, the organic light emitting layer 230 may be formed by sequentially forming a hole injection layer, a hole transport layer, a light emitting layer, an electron transport layer, and an electron injection layer from the first electrode 210 side. The materials described above can be used for materials of the layers constituting the organic light emitting layer 230.

Figure 14:
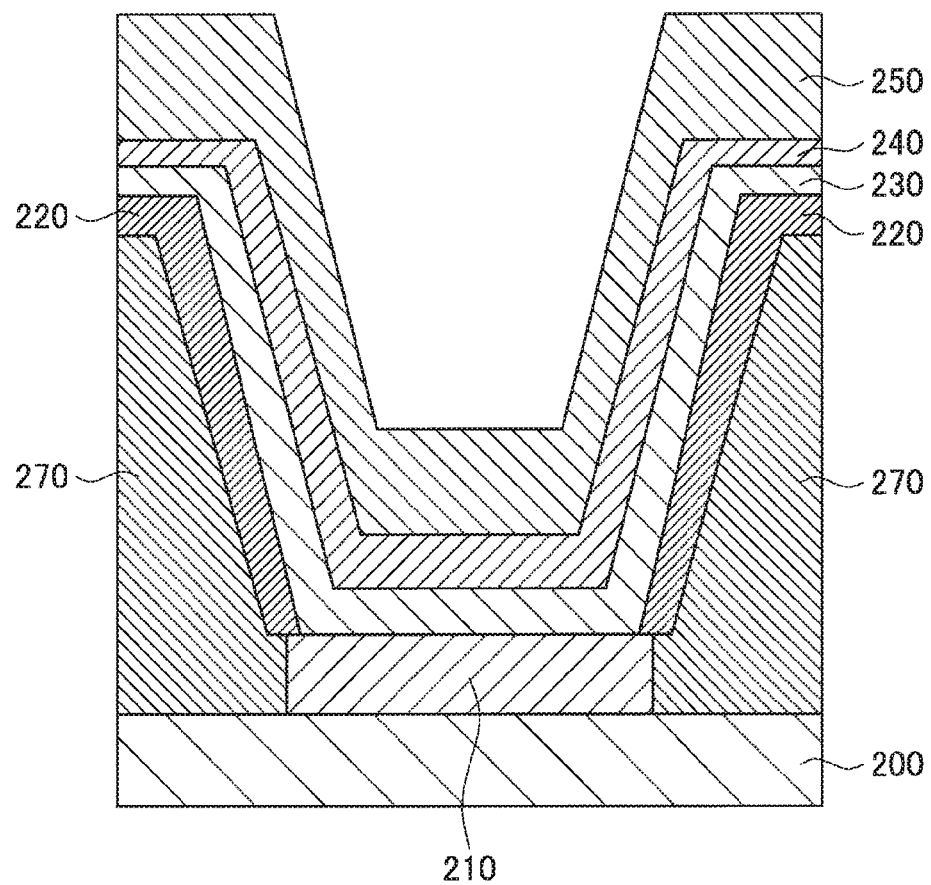
FIG. 14 is a cross-sectional view illustrating one step of the method for manufacturing the display device according to the second embodiment.

Next, as illustrated in FIG. 14, the second electrode 240 is formed on the organic light emitting layer 230 using sputtering or the like, and the protective layer 250 is formed on the second electrode 240. For example, the second electrode 240 may be formed by forming a film of a transparent conductive material such as indium zinc oxide or indium tin oxide. Furthermore, the protective layer 250 may be formed, for example, by forming a $SiN_x$ film using CVD or the like, and then forming a high refractive index laminated film of $AlO_x$ and $TiO_x$ on the $SiN_x$ film using ALD or the like.

Figure 15:
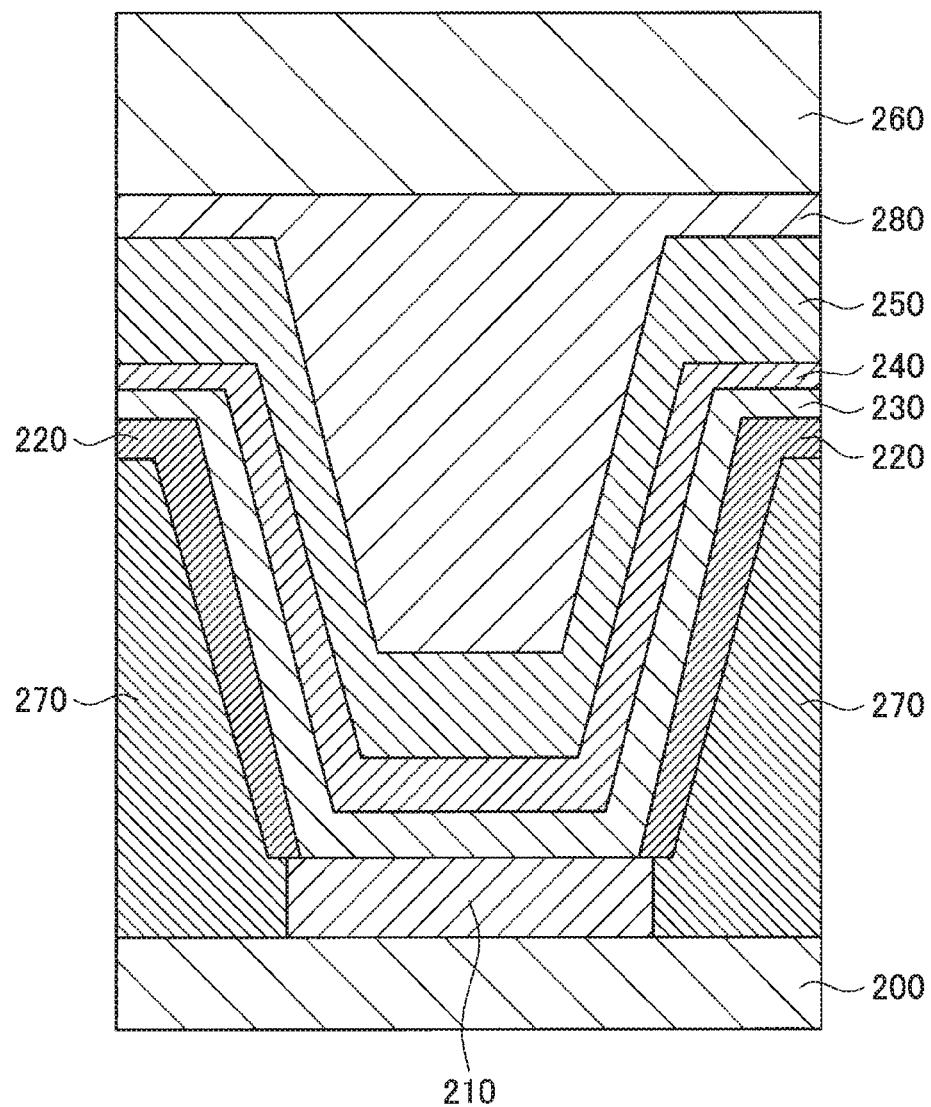
FIG. 15 is a cross-sectional view illustrating one step of the method for manufacturing the display device according to the second embodiment.

Subsequently, as illustrated in FIG. 15, the second member 280 is formed on the protective layer 250 so as to embed the recess structure, and the color filter 260 is formed on the second member 280. For example, the second member 280 can be formed so as to embed the recess structure on the protective layer 250 by using a spin coating method or the like. Alternatively, by forming the second member 280 on the entire surface of the protective layer 250 and then removing the second member 280 other than the inside of the recess structure using a photolithography method, the second member 280 can be formed. For example, the second member 280 may contain an acrylic resin in which a filler of $TiO_2$ or $ZrO_2$ is dispersedly contained.

Furthermore, the color filter 260 is formed on the second member 280 by performing patterning using photolithography or the like. Specifically, first, a black matrix which is a shielding layer is formed on the entire surface of the second member 280, and then an opening is formed in the black matrix using photolithography or the like. Thereafter, by forming any one of a red filter, a green filter, and a blue filter in the opening, the color filter 260 can be formed.

The display device according to the present embodiment can be manufactured through the above steps. Note that the above manufacturing method is merely an example, and the method for manufacturing the display device according to the present embodiment is not limited to the above.

[2.3. Modification]

Subsequently, modifications of the display device according to the present embodiment will be described with reference to FIGS. 16 to 18. These modifications are examples in which a region where the insulating layer 220 is formed is different from that in the display device illustrated in FIG. 8. Even in the cases of these modifications, the display device according to the present embodiment can suppress occurrence of leakage of a drive current between adjacent light emitting elements.

(First Modification)

First, a display device according to a first modification of the present embodiment will be described with reference to FIG. 16. FIG. 16 is a cross-sectional view of the display device according to the first modification, cut in a lamination direction.

Figure 16:
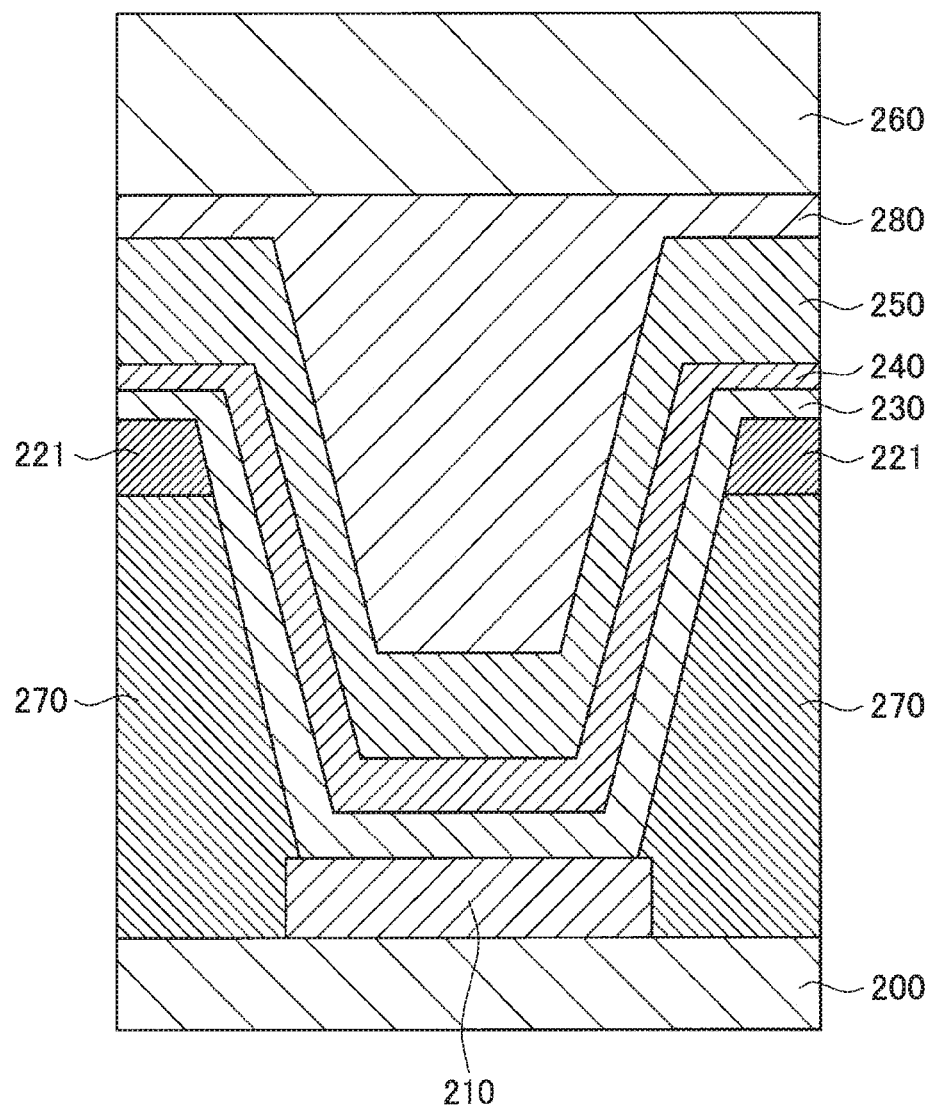
FIG. 16 is a cross-sectional view of a display device according to a first modification of the second embodiment, cut in a lamination direction.

As illustrated in FIG. 16, the display device according to the first modification is different from the display device illustrated in FIG. 8 in that an insulating layer 221 (corresponding to the insulating layer 220) is not disposed on an inclined portion of the first member 270 but is disposed on a flat portion of the first member 270 outside the recess structure.

The insulating layer 221 is disposed on the flat portion of the first member 270 to electrically separate light emitting elements from each other. Furthermore, the insulating layer 221 contains an inorganic nitride and is positively charged. As a result, the insulating layer 221 can suppress generation of a highly conductive path that causes leakage of a drive current at an interface of the organic light emitting layer 230 in contact with the insulating layer 221.

In the display device according to the first modification, the inclined portion of the first member 270 can be brought into contact with the organic light emitting layer 230. Therefore, light emitted from the organic light emitting layer 230 can be reflected more efficiently in the first member 270 using a difference in refractive index. Meanwhile, the insulating layer 221 can block a highly conductive path generated in the organic light emitting layer 230 in a region above the flat portion of the first member 270 where the insulating layer 221 is in contact with the organic light emitting layer 230, and therefore can suppress occurrence of leakage of a drive current between adjacent light emitting elements.

Therefore, the display device according to the first modification can improve the light extraction efficiency from a light emitting element while suppressing leakage of a drive current between adjacent light emitting elements.

(Second Modification)

Next, a display device according to a second modification of the present embodiment will be described with reference to FIG. 17. FIG. 17 is a cross-sectional view of the display device according to the second modification, cut in a lamination direction.

Figure 17:
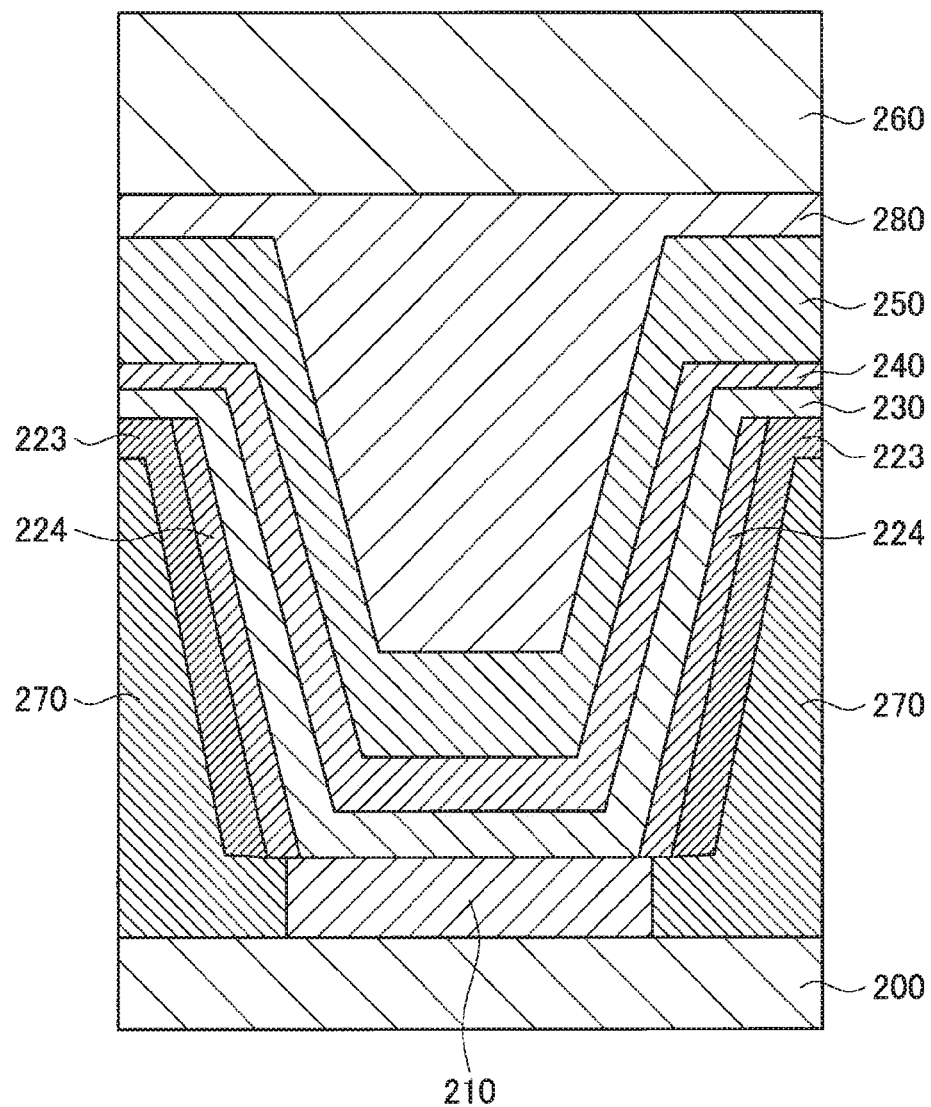
FIG. 17 is a cross-sectional view of a display device according to a second modification of the second embodiment, cut in a lamination direction.

As illustrated in FIG. 17, the display device according to the second modification is different from the display device illustrated in FIG. 8 in that a reflective auxiliary layer 224 is disposed between an insulating layer 223 (corresponding to the insulating layer 220) and the organic light emitting layer 230.

The insulating layer 223 is disposed along the first member 270 between the first electrodes 210 to electrically separate light emitting elements from each other. Furthermore, the insulating layer 223 contains an inorganic nitride and is positively charged. As a result, the insulating layer 223 can suppress generation of a highly conductive path that causes leakage of a drive current at an interface of the organic light emitting layer 230 in contact with the insulating layer 223.

The reflective auxiliary layer 224 is disposed between the insulating layer 223 (corresponding to the insulating layer 220) and the organic light emitting layer 230 at an inclined portion of the first member 270. Furthermore, the reflective auxiliary layer 224 contains an insulating material having a smaller refractive index than the organic light emitting layer 230. In particular, the reflective auxiliary layer 224 desirably contains an insulating material having a larger difference in refractive index from the organic light emitting layer 230. For example, the reflective auxiliary layer 224 may contain silicon oxide ($SiO_x$).

In the display device according to the second modification, the reflective auxiliary layer 224 having a smaller refractive index than the organic light emitting layer 230 and a large difference in refractive index from the organic light emitting layer 230 is disposed in the inclined portion of the first member 270. As a result, the display device according to the second modification can improve the light extraction efficiency of a light emitting element by reflecting light emitted from the organic light emitting layer 230 at an interface between the organic light emitting layer 230 and the reflective auxiliary layer 224. Meanwhile, the insulating layer 223 can block a highly conductive path generated in the organic light emitting layer 230 in a region above the flat portion of the first member 270 where the insulating layer 223 is in contact with the organic light emitting layer 230, and therefore can suppress occurrence of leakage of a drive current between adjacent light emitting elements.

Therefore, the display device according to the second modification can improve the light extraction efficiency of a light emitting element while suppressing leakage of a drive current between adjacent light emitting elements.

(Third Modification)

Next, a display device according to a third modification of the present embodiment will be described with reference to FIG. 18. FIG. 18 is a cross-sectional view of the display device according to the third modification, cut in a lamination direction.

Figure 18:
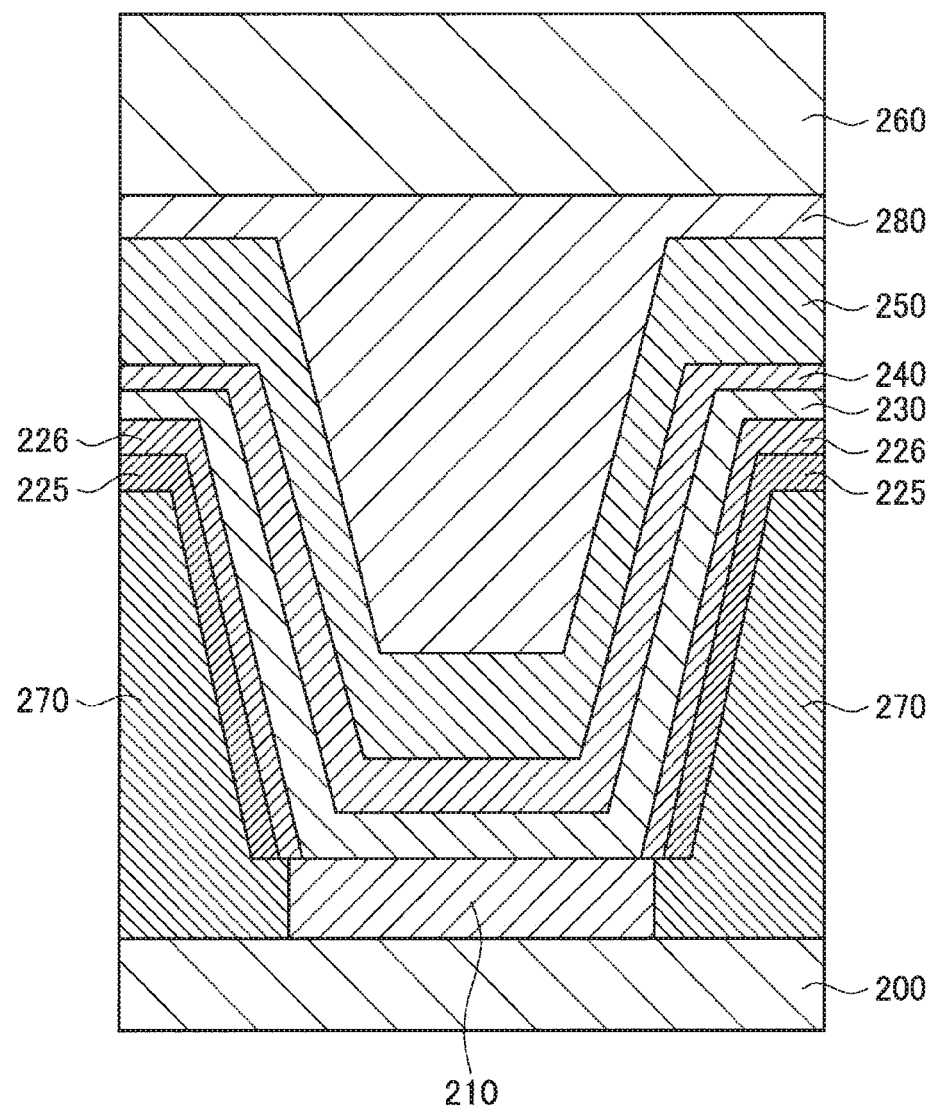
FIG. 18 is a cross-sectional view of a display device according to a third modification of the second embodiment, cut in a lamination direction.

As illustrated in FIG. 18, the display device according to the third modification is different from the display device illustrated in FIG. 8 in that a reflective auxiliary layer 226 is disposed between an insulating layer 225 (corresponding to the insulating layer 220) and the organic light emitting layer 230.

The insulating layer 225 is disposed along the first member 270 between the first electrodes 210 to electrically separate light emitting elements from each other. Furthermore, the insulating layer 225 contains an inorganic nitride and is positively charged. Since the insulating layer 225 is not in contact with the organic light emitting layer 230 but is positively charged, the insulating layer 225 cancels a negative charge generated in the reflective auxiliary layer 226 and prevents the entire layer including the insulating layer 225 and the reflective auxiliary layer 226 from being negatively charged. Therefore, even in such a case, the insulating layer 225 can suppress generation of a highly conductive path that causes leakage of a drive current at an interface of the organic light emitting layer 130 in contact with the reflective auxiliary layer 226.

The reflective auxiliary layer 226 is disposed between the insulating layer 223 (corresponding to the insulating layer 220) and the organic light emitting layer 230. Furthermore, the reflective auxiliary layer 226 contains an insulating material having a smaller refractive index than the organic light emitting layer 230. In particular, the reflective auxiliary layer 226 desirably contains an insulating material having a larger difference in refractive index from the organic light emitting layer 230. For example, the reflective auxiliary layer 226 may contain silicon oxide ($SiO_x$).

In the display device according to the third modification, the reflective auxiliary layer 226 having a smaller refractive index than the organic light emitting layer 230 and a large difference in refractive index from the organic light emitting layer 230 is disposed between the insulating layer 225 and the organic light emitting layer 230. As a result, the display device according to the third modification can improve the light extraction efficiency of a light emitting element by reflecting light emitted from the organic light emitting layer 230 at an interface between the organic light emitting layer 230 and the reflective auxiliary layer 226.

Meanwhile, in the display device according to the third modification, the insulating layer 225 is positively charged. As a result, a negative charge of the reflective auxiliary layer 226 is cancelled, and holes are not accumulated at an interface of the organic light emitting layer 130 in contact with the reflective auxiliary layer 226. Therefore, a highly conductive path is not generated. Therefore, the display device according to the third modification can suppress occurrence of leakage of a drive current between adjacent light emitting elements.

Therefore, the display device according to the third modification can improve the light extraction efficiency of a light emitting element while suppressing leakage of a drive current between adjacent light emitting elements.

3. Application Example of Display Device

Subsequently, an application example of the display device according to the first or second embodiment of the present disclosure will be described with reference to FIGS. 19 to 22. Each of FIGS. 19 to 22 is an external view illustrating an example of an electronic apparatus to which the display device according to either one of the embodiments of the present disclosure can be applied.

Figure 19:
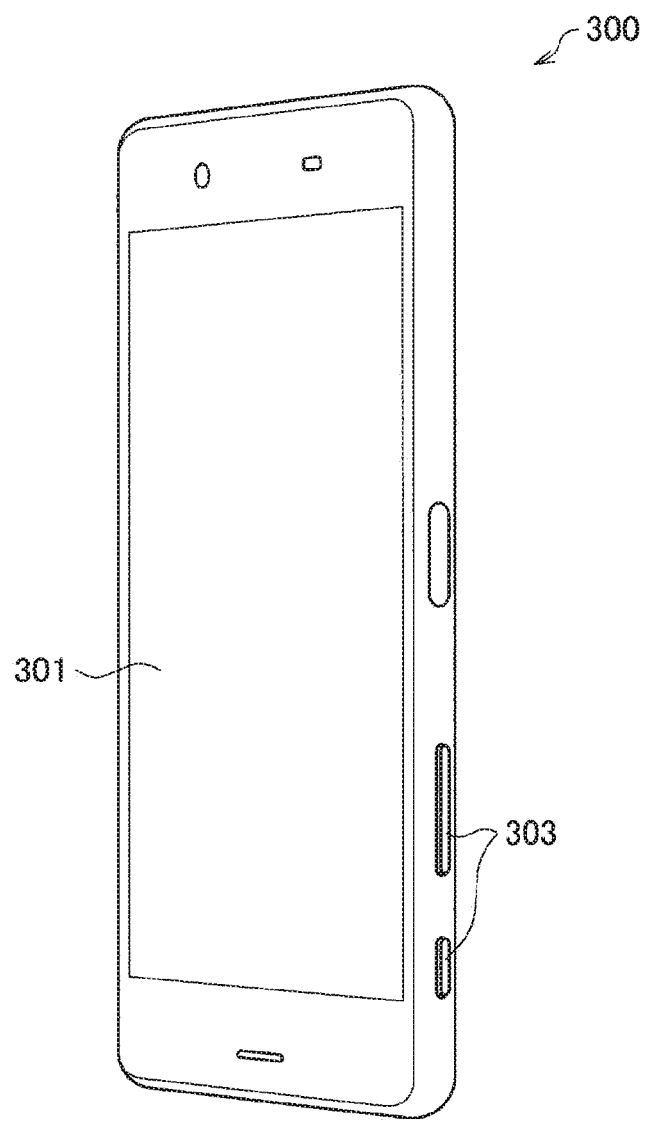
FIG. 19 is an external view illustrating an example of an electronic apparatus to which the display device according to either one of the embodiments of the present disclosure can be applied.

For example, the display device according to either one of the embodiments of the present disclosure can be applied to a display unit of an electronic apparatus such as a smartphone. Specifically, as illustrated in FIG. 19, a smartphone 300 includes a display unit 301 that displays various types of information, and an operation unit 303 including a button or the like that receives an operation input by a user. Here, the display unit 301 may be constituted by the display device according to either one of the present embodiments.

Figure 20:
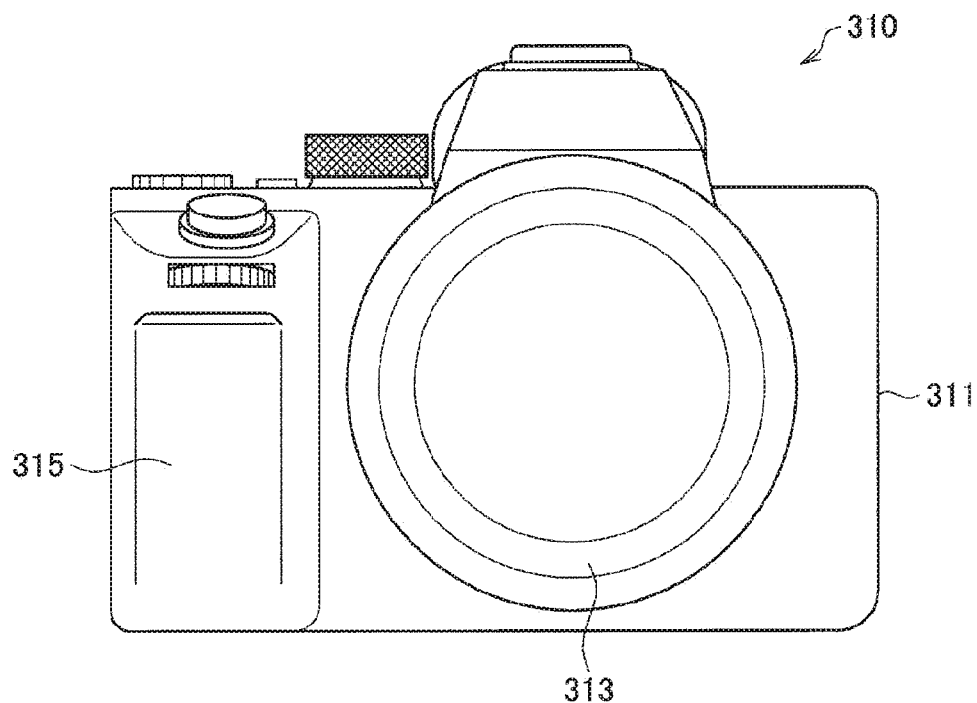
FIG. 20 is an external view illustrating another example of the electronic apparatus to which the display device according to either one of the embodiments of the present disclosure can be applied.
Figure 21:
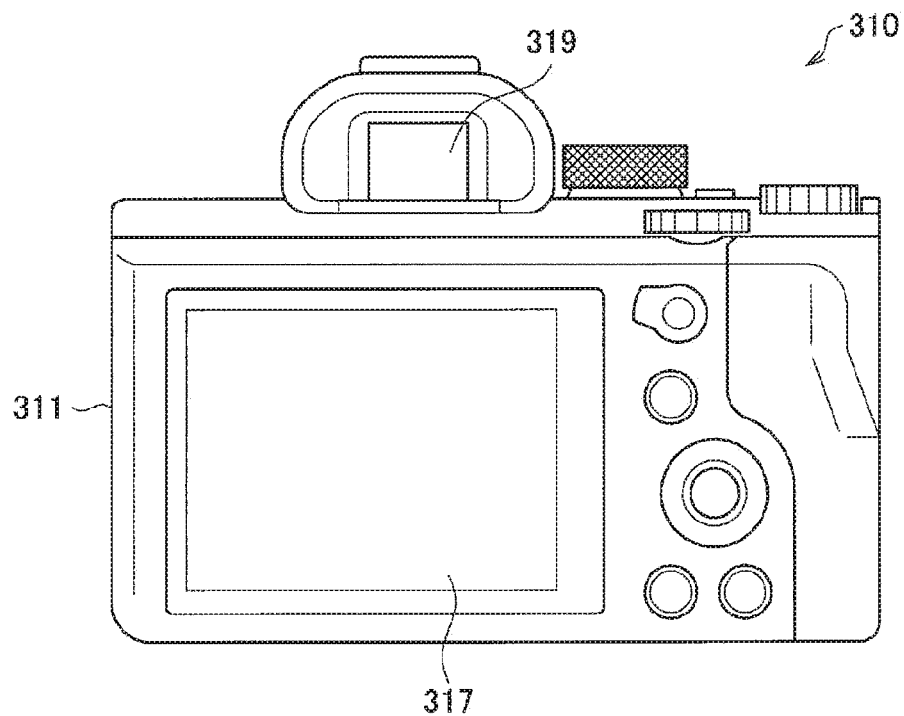
FIG. 21 is an external view illustrating another example of the electronic apparatus to which the display device according to either one of the embodiments of the present disclosure can be applied.

Furthermore, for example, the display device according to either one of the present embodiments can be applied to a display unit of an electronic apparatus such as a digital camera. Specifically, as illustrated in FIGS. 20 and 21, a digital camera 310 includes a main body (camera body) 311, an interchangeable lens unit 313, a grip unit 315 held by a user at the time of photographing, a monitor unit 317 that displays various types of information, and an electronic view finder (EVF) 319 that displays a through image observed by a user at the time of photographing. Note that FIG. 20 illustrates an external appearance of the digital camera 310 viewed from the front (in other words, an object side), and FIG. 21 illustrates an external appearance of the digital camera 310 viewed from the rear (in other words, a photographer side). Here, the monitor unit 317 and the EVF 319 may be constituted by the display device according to either one of the present embodiments.

Figure 22:
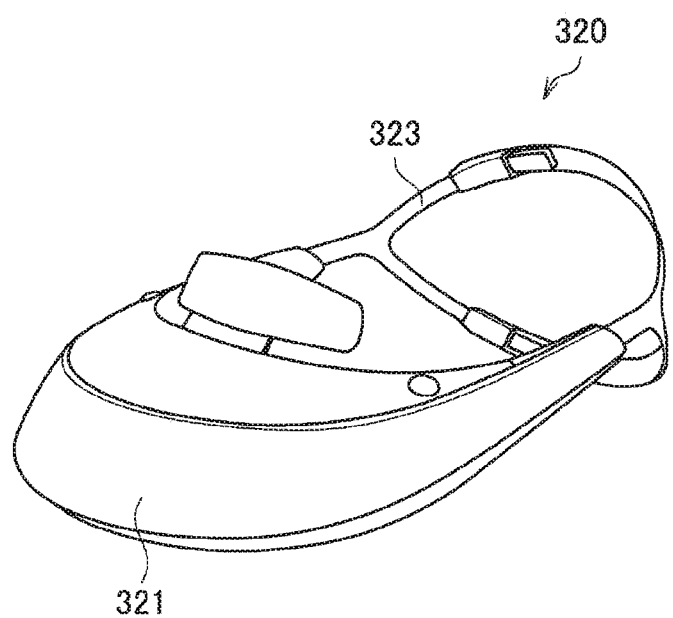
FIG. 22 is an external view illustrating another example of the electronic apparatus to which the display device according to either one of the embodiments of the present disclosure can be applied.

Furthermore, for example, the display device according to either one of the present embodiments can be applied to a display unit of an electronic apparatus such as a head mounted display (HMD). Specifically, as illustrated in FIG. 22, the HMD 320 includes a display unit 321 that displays various types of information, and a mounting unit 323 mounted on the head of a user at the time of mounting. Here, the display unit 321 may be constituted by the display device according to either one of the present embodiments. Moreover, the display device according to either one of the present embodiments can be applied not only to a display unit of a non-transmissive HMD illustrated in FIG. 22 but also to a display unit of a transmissive HMD such as a glasses type HMD.

Note that the electronic apparatus to which the display device according to either one of the present embodiments can be applied is not limited to the above examples. The display device according to either one of the present embodiments can be applied to a display unit of an electronic apparatus in any field that performs display on the basis of an image signal input from the outside or an image signal generated internally. Examples of such an electronic apparatus include a television device, an electronic book, a personal digital assistant (PDA), a laptop personal computer, a video camera, and a game device.

Hitherto, preferable embodiments of the present disclosure have been described in detail with reference to the accompanying drawings, but the technical scope of the present disclosure is not limited to such examples. It is obvious that a person having ordinary knowledge in the technical field to which the present disclosure belongs can conceive of various change examples and modification examples within a range of the technical idea described in the claims, and it is understood that these change examples and modification examples are naturally within the technical scope of the present disclosure.

Furthermore, the effects described in the present specification are merely illustrative or exemplary, and are not limiting. That is, the technique according to the present disclosure can exhibit another effect obvious to those skilled in the art from the description of the present specification together with the above effect or in place of the above effect.

Note that the following configurations are also within the technical scope of the present disclosure.

(1)

A display device including:

a plurality of light emitting elements having an organic light emitting layer sandwiched between a first electrode disposed for each of the light emitting elements and a second electrode in a lamination direction and arrayed on a plane; and an insulating layer disposed between the first electrodes, in which at least a part of a film thickness region in the insulating layer contains a positively charged inorganic nitride.

(2)

The display device according to (1), in which the first electrode is an anode electrode.

(3)

The display device according to (1) or (2), in which a film thickness region containing a positively charged inorganic nitride is a film thickness region in contact with the organic light emitting layer.

(4)

The display device according to (3), in which the insulating layer is constituted by a laminated film of a plurality of insulating films, and an insulating film in contact with the organic light emitting layer among the plurality of insulating films contains a positively charged inorganic nitride.

(5)

The display device according to any one of (1) to (4), in which a side surface of the first electrode is covered with the insulating layer.

(6)

The display device according to any one of (1) to (5), in which the second electrode and the organic light emitting layer are disposed continuously over the light emitting elements.

(7)

The display device according to any one of (1) to (6), in which the inorganic nitride contains no oxygen atom.

(8)

The display device according to (7), in which the inorganic nitride is silicon nitride.

(9)

The display device according to (8), in which a ratio of Si—H/N—H in the silicon nitride is less than 1%.

(10)

The display device according to any one of (1) to (9), in which each of the light emitting elements is disposed inside a recess structure having the first electrode as a bottom and having a first member disposed between the light emitting elements as a side wall.

(11)

The display device according to (10), in which the first member has a smaller refractive index than the organic light emitting layer.

(12)

The display device according to (10) or (11), in which the insulating layer is disposed outside the recess structure and in a region in contact with the organic light emitting layer.

(13)

An electronic apparatus including a display unit including:

a plurality of light emitting elements having an organic light emitting layer sandwiched between a first electrode disposed for each of the light emitting elements and a second electrode in a lamination direction and arrayed on a plane; and an insulating layer disposed between the first electrodes, in which at least a part of a film thickness region in the insulating layer contains a positively charged inorganic nitride.

REFERENCE SIGNS LIST 100, 200 Substrate
110, 210 First electrode
111 Contact plug
120, 220, 221, 223, 225 Insulating layer
130, 230 Organic light emitting layer
140, 240 Second electrode
150, 250 Protective layer
161, 260 Color filter
163 Shielding layer
224, 226 Reflective auxiliary layer
270 First member
280 Second member

The invention claimed is:

1. A display device, comprising:
a plurality of drive circuits;
a first insulating layer on the plurality of drive circuits;
a plurality of light emitting elements, wherein
the plurality of light emitting elements includes a first light emitting element and a second light emitting element,
each of the first light emitting element and the second light emitting element includes a first electrode, an organic light emitting layer, and a second electrode, and
the organic light emitting layer is between the first electrode and the second electrode; and
a second insulating layer between the first electrode of the first light emitting element and the first electrode of the second light emitting element, wherein
a material of the second insulating layer includes silicon and nitride,
a groove is between the first electrode of the first light emitting element and the first electrode of the second light emitting element, and
a part of the second insulating layer is in the groove.

2. The display device according to claim 1, wherein the first electrode is an anode electrode.

3. The display device according to claim 1, wherein a film thickness region that includes a positively charged inorganic nitride is a film thickness region in contact with the organic light emitting layer.

4. The display device according to claim 3, wherein
each of the first insulating layer and the second insulating layer includes a laminated film of a plurality of insulating films, and
an insulating film in contact with the organic light emitting layer among the plurality of insulating films contains a positively charged silicon nitride.

5. The display device according to claim 1, wherein a side surface of the first electrode is covered with the second insulating layer.

6. The display device according to claim 1, wherein the second electrode and the organic light emitting layer are continuously over the plurality of light emitting elements.

7. The display device according to claim 1, wherein the material of the second insulating layer contains no oxygen atom.

8. The display device according to claim 1, wherein a ratio of Si—H/N—H in the material of the second insulating layer is less than 1%.

9. The display device according to claim 1, wherein
each of the first light emitting element and the second light emitting element is inside a recess structure, and
the recess structure includes the first electrode as a bottom and a first member between the first light emitting element and the second light emitting element as a side wall.

10. The display device according to claim 9, wherein the first member has a smaller refractive index than the organic light emitting layer.

11. The display device according to claim 9, wherein the first insulating layer is outside the recess structure and in a region in contact with the organic light emitting layer.

12. The display device according to claim 1, wherein the second insulating layer further includes a positively charged silicon nitride.

13. An electronic apparatus, comprising:
a display unit that includes:
a plurality of drive circuits;
a first insulating layer on the plurality of drive circuits;
a plurality of light emitting elements, wherein
the plurality of light emitting elements includes a first light emitting element and a second light emitting element,
each of the first light emitting element and the second light emitting element includes a first electrode, an organic light emitting layer, and a second electrode, and
the organic light emitting layer is between the first electrode and the second electrode; and a second insulating layer between the first electrode of
the first light emitting element and the first electrode
of the second light emitting element, wherein
a material of the second insulating layer includes
silicon and nitride,
a groove is between the first electrode of the first
light emitting element and the first electrode of the
second light emitting element, and
a part of the second insulating layer is in the groove.

* * * * *